US012575134B2

(12) United States Patent
Cheng et al.

(10) Patent No.: US 12,575,134 B2
(45) Date of Patent: Mar. 10, 2026

(54) MULTI-GATE DEVICES WITH REDUCED CONTACT RESISTANCE AND METHODS OF FORMING THE SAME

(71) Applicant: Taiwan Semiconductor Manufacturing Company, Ltd., Hsin-Chu (TW)

(72) Inventors: Chun-Fai Cheng, Hong Kong (TW); Bwo-Ning Chen, Keelung (TW); Chang-Miao Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 676 days.

(21) Appl. No.: 17/901,718

(22) Filed: Sep. 1, 2022

(65) Prior Publication Data

US 2024/0079465 A1    Mar. 7, 2024

(51) Int. Cl.
H10D 30/67 (2025.01)
H01L 21/285 (2006.01)
(Continued)

(52) U.S. Cl.
CPC ..... H10D 30/6735 (2025.01); H10D 30/6757 (2025.01); H10D 62/151 (2025.01);
(Continued)

(58) Field of Classification Search
CPC ............. H10D 30/797; H10D 30/6219; H10D 84/0149; H10D 84/017; H10D 84/013; H10D 84/0186; H10D 64/256; H10D 30/6713; H10D 30/0212; H10D 64/251; H10D 84/0133; H10D 62/149; H10D 64/259; H10D 30/0198; H10D 64/017;
(Continued)

(56) References Cited

U.S. PATENT DOCUMENTS 9,443,769 B2 *  9/2016  Wang ................. H10D 84/0149
10,276,442 B1 *  4/2019  Xie .................... H10D 84/0128
(Continued)

FOREIGN PATENT DOCUMENTS

TW       202013503 A       4/2020
TW       202145317 A       12/2021

OTHER PUBLICATIONS

Cheng et al., "Multi-Gate Devices and Method of Forming the Same," U.S. Appl. No. 17/832,338, filed Jun. 3, 2022, Assignee: Taiwan Semiconductor Manufacturing Company, Ltd., 36 pages of Specification, 46 pages of Drawings.
(Continued)

*Primary Examiner* — Sonya McCall-Shepard
(74) *Attorney, Agent, or Firm* — HAYNES AND BOONE, LLP

(57) ABSTRACT

Semiconductor devices and methods of forming the same are provided. In an embodiment, an exemplary semiconductor device includes a vertical stack of channel members disposed over a substrate, a gate structure wrapping around each channel member of the vertical stack of channel members, a source/drain feature electrically coupled to the vertical stack of channel members, a silicide layer formed on more than one side of the source/drain feature, and a source/drain contact electrically coupled to the source/drain feature via the silicide layer.

20 Claims, 18 Drawing Sheets

(51) Int. Cl.

| | |
|---|---|
| *H10D 30/01* | (2025.01) |
| *H10D 30/69* | (2025.01) |
| *H10D 62/10* | (2025.01) |
| *H10D 62/13* | (2025.01) |
| *H10D 62/17* | (2025.01) |
| *H10D 62/822* | (2025.01) |
| *H10D 64/01* | (2025.01) |
| *H10D 84/01* | (2025.01) |
| *H10D 84/03* | (2025.01) |

(52) U.S. Cl.
CPC ......... *H10D 64/017* (2025.01); *H10D 64/021* (2025.01); *H10D 84/0128* (2025.01); *H10D 84/013* (2025.01); *H10D 84/0147* (2025.01); *H10D 84/038* (2025.01)

(58) Field of Classification Search
CPC ............... H10D 84/966; H10D 62/822; H10D 30/6735; H10D 30/6757; H10D 84/0128; H10D 64/021; H10D 84/0147; H10D 62/364; H01L 21/28518
See application file for complete search history.

(56) References Cited

U.S. PATENT DOCUMENTS

| | | | | |
|---|---|---|---|---|
| 2013/0015510 A1* | 1/2013 | Yan | ........................ | H10D 62/83 |
| | | | | 257/E21.409 |
| 2016/0315081 A1* | 10/2016 | Park | ..................... | H10D 62/151 |
| 2019/0333820 A1* | 10/2019 | Chang | ................. | H10D 84/853 |
| 2019/0341448 A1* | 11/2019 | Bourjot | ............. | H10D 30/6212 |
| 2020/0168742 A1* | 5/2020 | Wang | ............... | H01L 21/02532 |

OTHER PUBLICATIONS

Wong et al., "Methods for Forming Source/Drain Features" U.S. Appl. No. 17/667, 115, filed Feb. 8, 2022, Assignee: Taiwan Semiconductor Manufacturing Company, Ltd., 33 pages of Specification, 33 pages of Drawings.

* cited by examiner

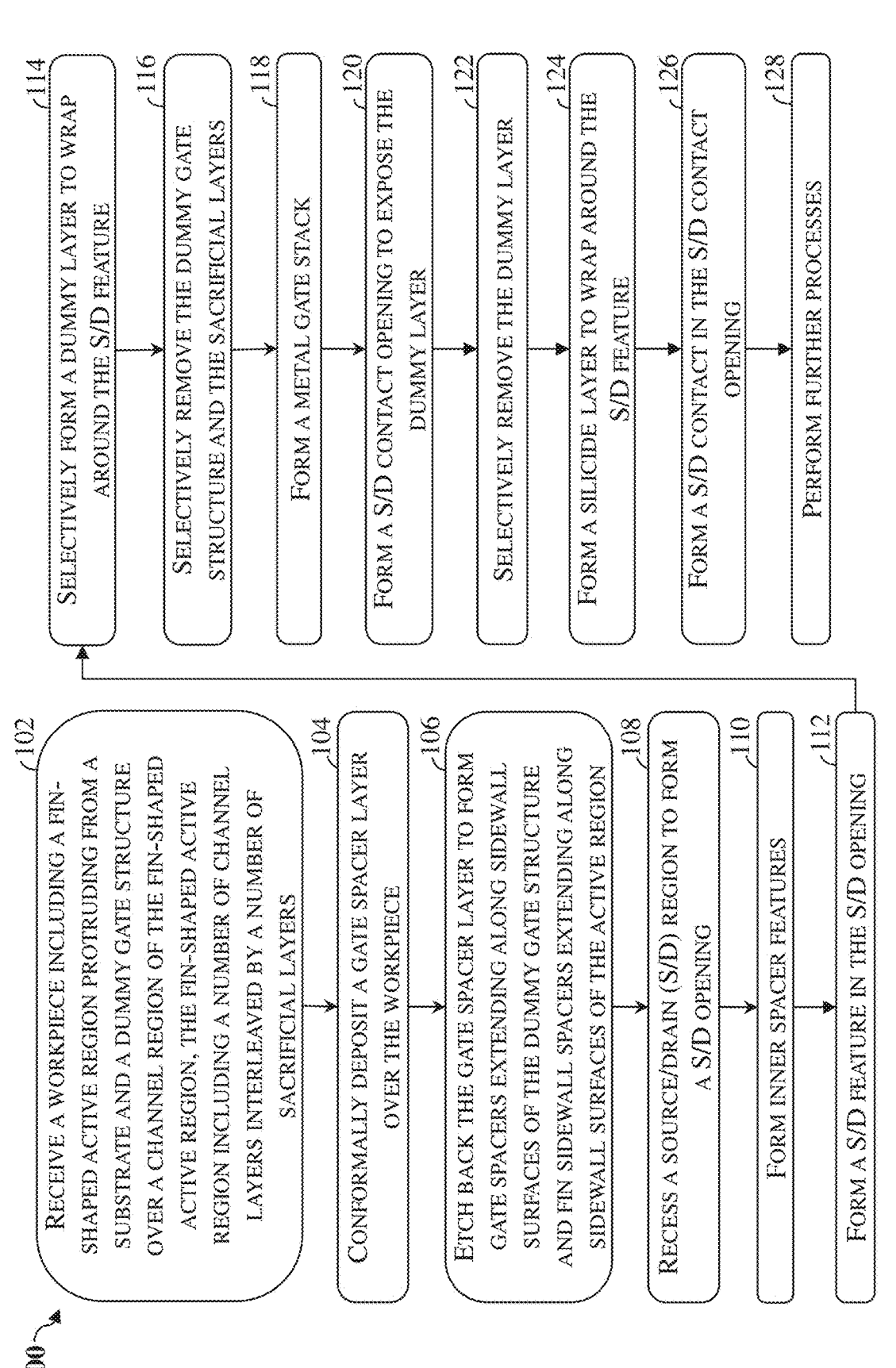

RECEIVE A WORKPIECE INCLUDING A FIN-SHAPED ACTIVE REGION PROTRUDING FROM A SUBSTRATE AND A DUMMY GATE STRUCTURE OVER A CHANNEL REGION OF THE FIN-SHAPED ACTIVE REGION, THE FIN-SHAPED ACTIVE REGION INCLUDING A NUMBER OF CHANNEL LAYERS INTERLEAVED BY A NUMBER OF SACRIFICIAL LAYERS 102

CONFORMALLY DEPOSIT A GATE SPACER LAYER OVER THE WORKPIECE 104

ETCH BACK THE GATE SPACER LAYER TO FORM GATE SPACERS EXTENDING ALONG SIDEWALL SURFACES OF THE DUMMY GATE STRUCTURE AND FIN SIDEWALL SPACERS EXTENDING ALONG SIDEWALL SURFACES OF THE ACTIVE REGION 106

RECESS A SOURCE/DRAIN (S/D) REGION TO FORM A S/D OPENING 108

FORM INNER SPACER FEATURES 110

FORM A S/D FEATURE IN THE S/D OPENING 112

SELECTIVELY FORM A DUMMY LAYER TO WRAP AROUND THE S/D FEATURE 114

SELECTIVELY REMOVE THE DUMMY GATE STRUCTURE AND THE SACRIFICIAL LAYERS 116

FORM A METAL GATE STACK 118

FORM A S/D CONTACT OPENING TO EXPOSE THE DUMMY LAYER 120

SELECTIVELY REMOVE THE DUMMY LAYER 122

FORM A SILICIDE LAYER TO WRAP AROUND THE S/D FEATURE 124

FORM A S/D CONTACT IN THE S/D CONTACT OPENING 126

PERFORM FURTHER PROCESSES 128

MULTI-GATE DEVICES WITH REDUCED CONTACT RESISTANCE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices are introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A Fin-FET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of a GAA transistor may be formed from nanowires, nanosheets, other nanostructures, and/or other suitable structures.

As the dimensions of the multi-gate devices shrink, a contact area between a source/drain feature and a silicide layer formed thereon also shrinks, and reducing a parasitic resistance is thus becoming more and more challenging. Although existing multi-gate devices are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 illustrates a flow chart of a method for forming a semiconductor device, according to one or more aspects of the present disclosure.

DETAILED DESCRIPTION

Figure 2:
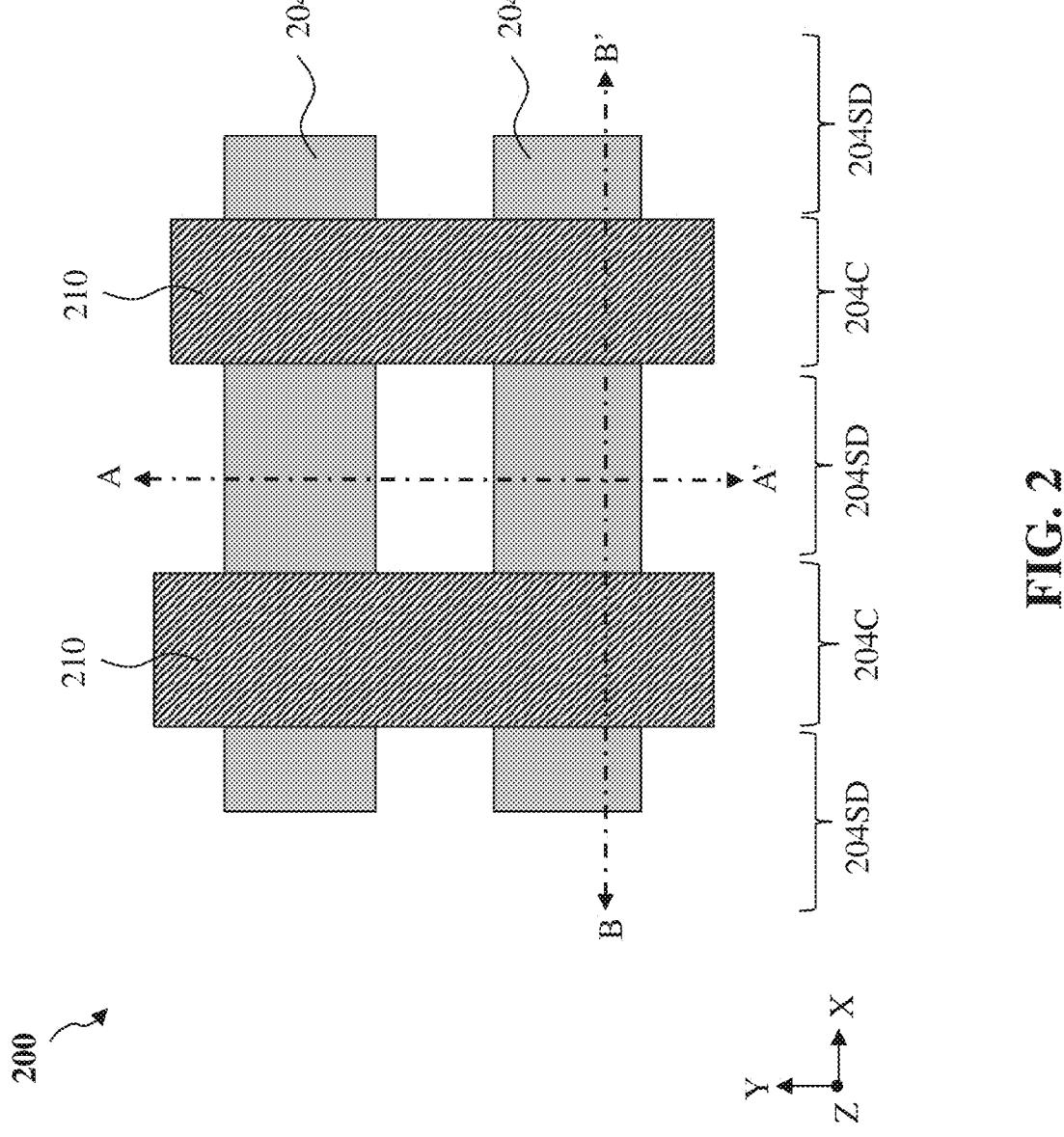
FIG. 2 illustrates a fragmentary top view of an exemplary workpiece to undergo various stages of operations in the method of FIG. 1, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

The present disclosure provides GAA transistors with reduced contact resistance. In an exemplary embodiment, a method for forming a GAA transistor with reduced contact resistance includes, after forming a source/drain feature, forming a dummy layer to wrap around the source/drain feature. That is, the dummy layer is disposed on more than one side of the source/drain feature. The method also includes forming a source/drain contact opening that exposes a portion of the dummy layer. The dummy layer may be then replaced by a silicide layer. In other words, the silicide layer is disposed on more than one side of the source/drain feature. A source/drain contact is then formed on the silicide layer and is electrically coupled to the source/drain feature by the silicide layer. By forming the silicide layer that is disposed on more than one side of the source/drain feature, a contact area between the silicide layer and the source/drain feature is increased. As such, a contact resistance of the GAA transistor may be advantageously reduced.

The various aspects of the present disclosure will now be described in more detail with reference to the figures. In that regard, FIG. 1 is a flowchart illustrating method 100 of forming a semiconductor device according to embodiments of the present disclosure. Method 100 is described below in conjunction with FIGS. 2, 3A-15A, 3B-15B, 16, 17, and 18, which are fragmentary top or cross-sectional views of a workpiece 200 at different stages of fabrication according to embodiments of method 100. Method 100 is merely an example and is not intended to limit the present disclosure to what is explicitly illustrated therein. Additional steps may be provided before, during and after the method 100, and some steps described can be replaced, eliminated, or moved around for additional embodiments of the method. Not all steps are described herein in detail for reasons of simplicity. Because the workpiece 200 will be fabricated into a semiconductor device upon conclusion of the fabrication processes, the workpiece 200 may be referred to as the semiconductor device 200 as the context requires. For avoidance of doubts, the X, Y and Z directions in FIGS. 2, 3A-15A, 3B-15B, and 16-18 are perpendicular to one another and are used consistently throughout the present disclosure. Throughout the present disclosure, like reference numerals denote like features unless otherwise excepted.

Referring to FIGS. 1, 2, 3A, and 3B, method 100 includes a block 102 where a workpiece 200 is received. The workpiece 200 includes a substrate 202. In an embodiment, the substrate 202 is a bulk silicon substrate (i.e., including bulk single-crystalline silicon). The substrate 202 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator substrate, a silicon germanium-on-insulator substrate, or a germanium-on-insulator substrate.

The workpiece 200 includes a number of fin-shaped active regions 204 protruding from the substrate 202. As shown in FIG. 2, each of the fin-shaped active regions 204 extends lengthwise along the X direction. The fin-shaped active region 204 is divided into channel regions 204C overlapped by dummy gate structures 210 (to be described below) and source/drain (S/D) regions 204SD adjacent to the channel regions 204C. Source/drain (S/D) regions may refer to a source or a drain, individually or collectively dependent upon the context. In embodiments represented in FIGS. 3A-3B, the fin-shaped active region 204 is formed from a portion 202t of the substrate 202 and a vertical stack 207 of alternating semiconductor layers 206 and 208 using a combination of lithography and etch steps. In the depicted embodiment, the vertical stack of alternating semiconductor layers 206 and 208 may include a number of channel layers 208 interleaved by a number of sacrificial layers 206. The channel layer 208 may be formed of silicon (Si) and the sacrificial layer 206 may be formed of silicon germanium (SiGe). The channel layers 208 and the sacrificial layers 206 may be epitaxially deposited on the substrate 202 using molecular beam epitaxy (MBE), vapor-phase epitaxy (VPE), ultra-high vacuum chemical vapor deposition (UHV-CVD), and/or other suitable epitaxial growth processes. In the present embodiments, the fin-shaped active region 204 includes three pairs of alternating sacrificial layers 206 and channel layers 208. In some embodiments, the fin-shaped active region 204 may include a total of four to ten pairs of alternating sacrificial layers 206 and channel layers 208; of course, other configurations may also be applicable depending upon specific design requirements. The fin-shaped active regions 204 each has a width W0 along the Y direction.

The workpiece 200 also includes an isolation feature 203 formed around each fin-shaped active region 204 to isolate the fin-shaped active region 204 from an adjacent fin-shaped active region. The isolation feature 203 may also be referred to as a shallow trench isolation (STI) feature and may include silicon oxide, silicon oxynitride, fluorine-doped silicate glass (FSG), a low-k dielectric, combinations thereof, and/or other suitable materials.

Figure 3B:
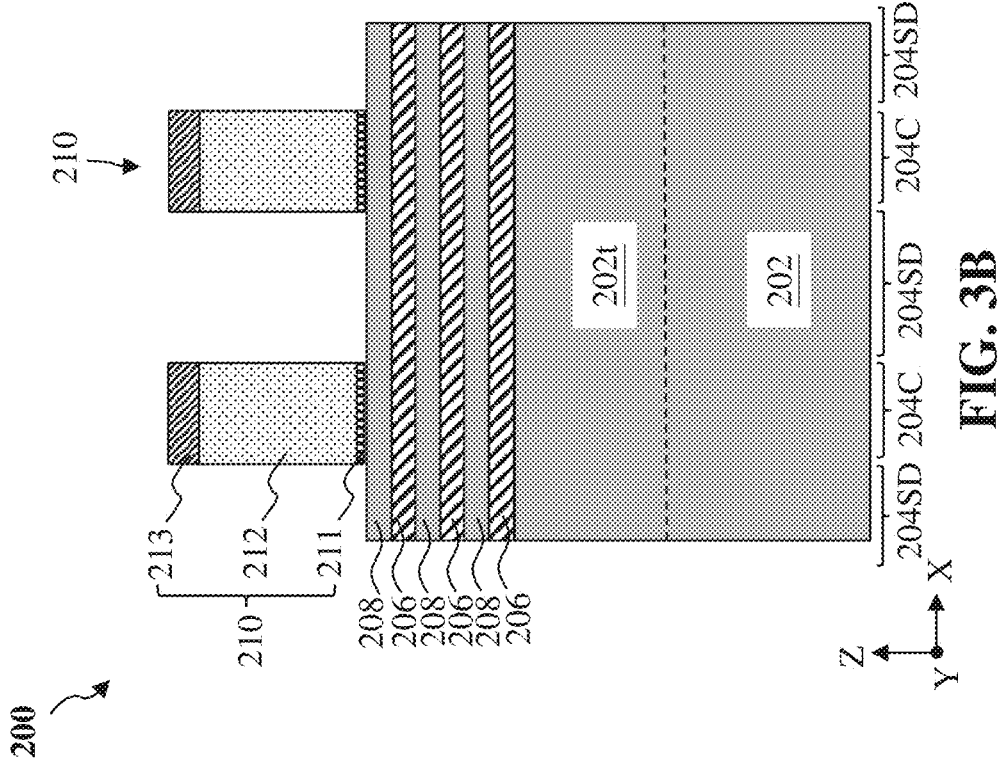
FIGS. 3B, 4B, 5B, 6B, 7B, 8B, 9B, 10B, 11B, 12B, 13B, 14B and 15B (FIGS. 3B-15B) illustrate fragmentary cross-sectional views of the workpiece taken along line B-B' as shown in FIG. 2 during various fabrication stages in the method of FIG. 1, according to various aspects of the present disclosure.
Figure 3A:
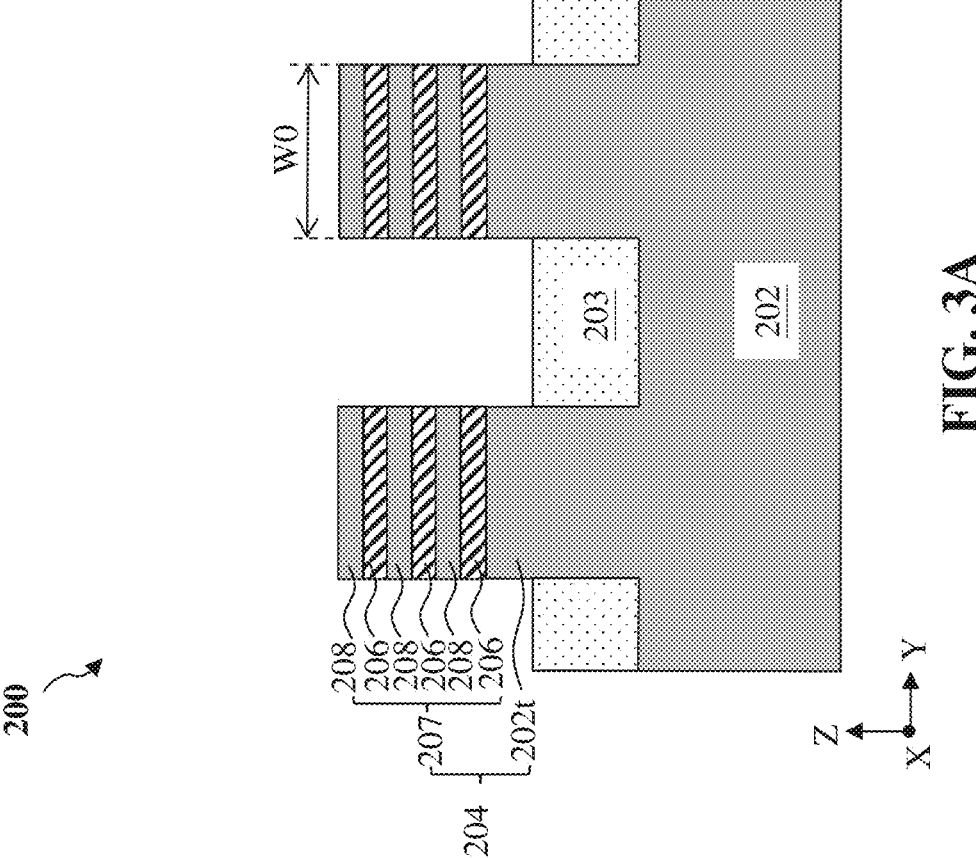
FIGS. 3A, 4A, 5A, 6A, 7A, 8A, 9A, 10A, 11A, 12A, 13A, 14A and 15A (FIGS. 3A-15A) illustrate fragmentary cross-sectional views of the workpiece taken along line A-A' as shown in FIG. 2 during various fabrication stages in the method of FIG. 1, according to one or more aspects of the present disclosure.

Still referring to FIGS. 2, 3A, and 3B, the workpiece 200 also includes dummy gate structures 210 disposed over channel regions 204C of the fin-shaped active region 204. The channel regions 204C and the dummy gate structures 210 also define source/drain (S/D) regions 204SD that are not vertically overlapped by the dummy gate structures 210. Two dummy gate structures 210 are shown in FIG. 2, but the workpiece 200 may include more dummy gate structures 210. In this embodiment, a gate replacement process (or gate-last process) is adopted where the dummy gate structures 210 serve as placeholders for functional gate stacks 228 (shown in FIG. 11B). Other processes and configuration are possible. The dummy gate structure 210 includes a dummy dielectric layer 211, a dummy gate electrode layer 212 over the dummy dielectric layer 211, and a gate-top hard mask layer 213 over the dummy gate electrode layer 212. The dummy dielectric layer 211 may include silicon oxide. The dummy gate electrode layer 212 may include polysilicon. The gate-top hard mask layer 213 may be a multi-layer structure that includes a silicon oxide layer and silicon nitride layer formed on the silicon oxide layer. Suitable deposition process, photolithography and etching process may be employed to form the dummy gate structure 210.

Figures 4A, 4B:
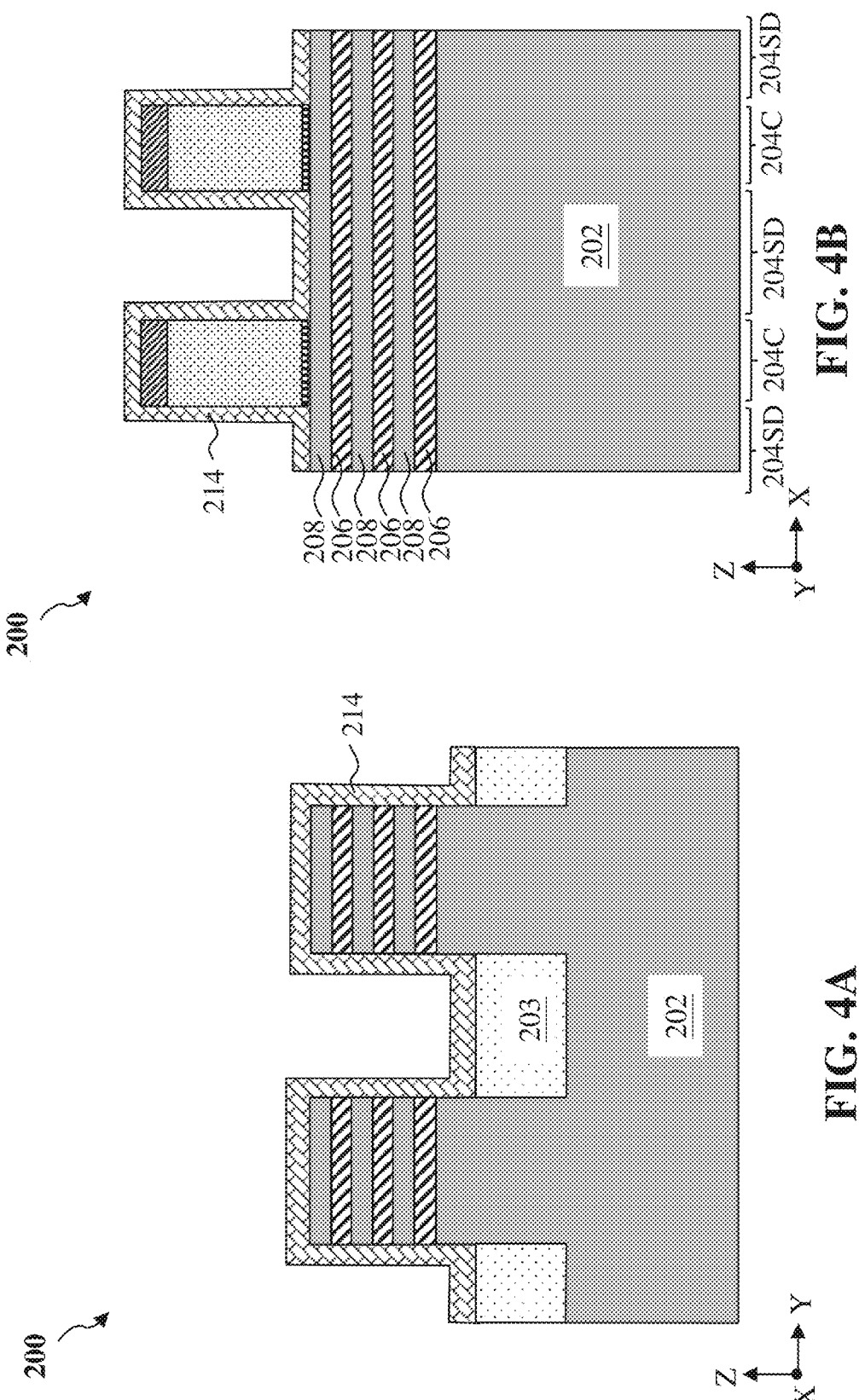

Referring to FIGS. 1, 4A, and 4B, method 100 includes a block 104 where a gate spacer layer 214 is conformally deposited over the workpiece 200. In some embodiments, the formation of the gate spacer layer 214 includes conformal deposition of one or more dielectric layers over the workpiece 200. In some embodiments, the gate spacer layer 214 may be deposited using chemical vapor deposition (CVD), sub-atmospheric chemical vapor deposition (SACVD), or atomic layer deposition (ALD) and may include silicon oxide, silicon nitride, silicon carbide, silicon oxynitride, silicon carbonitride, silicon oxycarbide, silicon oxycarbonitride, combinations thereof, or other suitable materials.

Figures 5A, 5B:
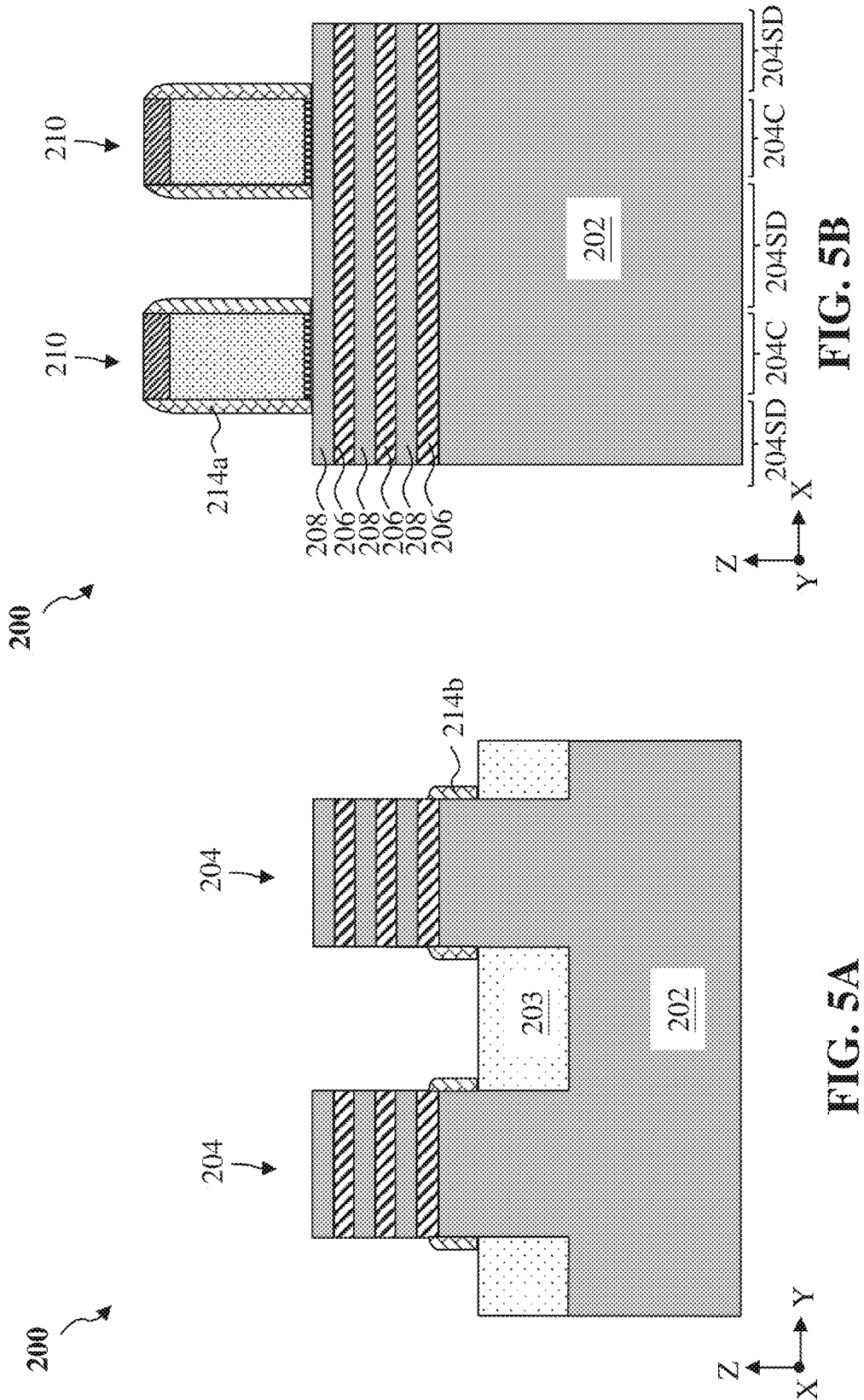

Referring to FIGS. 1, 5A, and 5B, method 100 includes a block 106 where the gate spacer layer 214 is etched back to form gate spacers 214a extending along sidewall surface of the dummy gate structures 210 and fin sidewall spacers 214b extending along sidewall surfaces of the active regions 204. That is, the gate spacers 214a and the fin sidewall spacers 214b are formed simultaneously. As shown in FIGS. 5A-5B, the gate spacer layer 214 is etched back to remove portions of the gate spacer layer 214 from, for example, top surfaces of the gate-top hard mask layers 213, top surfaces of the active regions 204, and top surfaces of the isolation features 203 to form the gate spacers 214a (shown in FIG. 5B) and the fin sidewall spacers 214b (shown in FIG. 5A). In some embodiments, the etch back of the gate spacer layer 214 may include performing an anisotropic etching process. In the present embodiment, the fin sidewall spacers 214b are in direct contact with top surfaces of the isolation features 203 and cover portions of the sidewall surfaces of the active regions 204. In the present embodiments, the fin sidewall spacers 214b are formed simultaneously along with the gate spacers 214a by etching the same gate spacer layer 214. In some other embodiments, the fin sidewall spacers 214b may be formed before or after the formation of the gate spacers 214a, and a composition of the fin sidewall spacers 214b may be the same as or different from a composition of the gate spacers 214a. In some embodiments, the workpiece 200 may not include the fin sidewall spacers 214b.

Figures 6A, 6B:
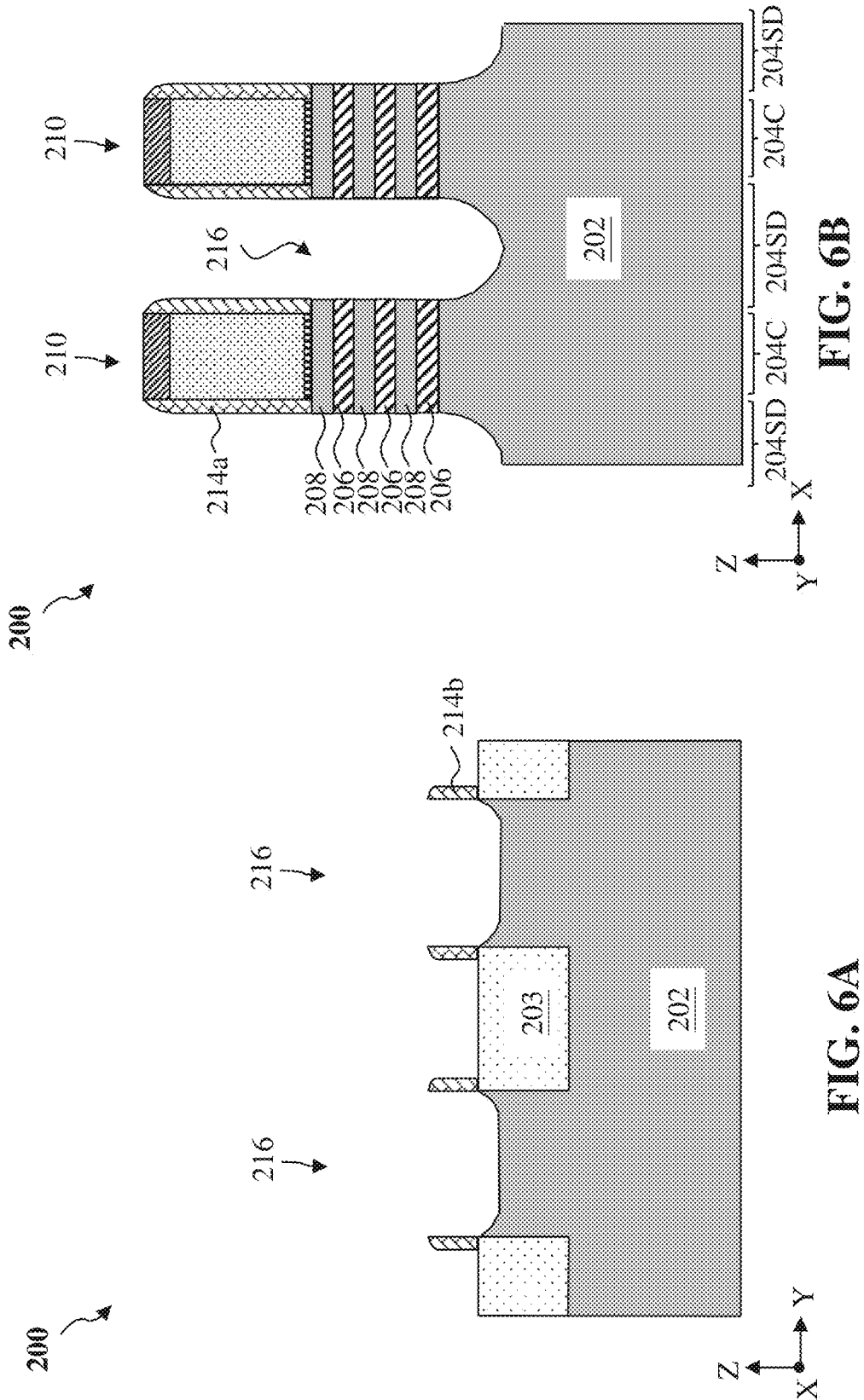

Referring to FIGS. 1, 6A, and 6B, method 100 includes a block 108 where source/drain regions 204SD of the fin-shaped active regions 204 are recessed to form source/drain openings 216. In some embodiments, the source/drain regions 204SD are anisotropically etched by a dry etching or other suitable etching processes to form source/drain openings 216. An exemplary dry etching process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In embodiments represented in FIGS. 6A and 6B, the source/drain openings 216 extend through the vertical stack 207 and partially extend into the substrate 202. As illustrated in FIG. 6B, sidewalls of the channel layers 208 and the sacrificial layers 206 are exposed in the source/drain openings 216.

Figures 7A, 7B:
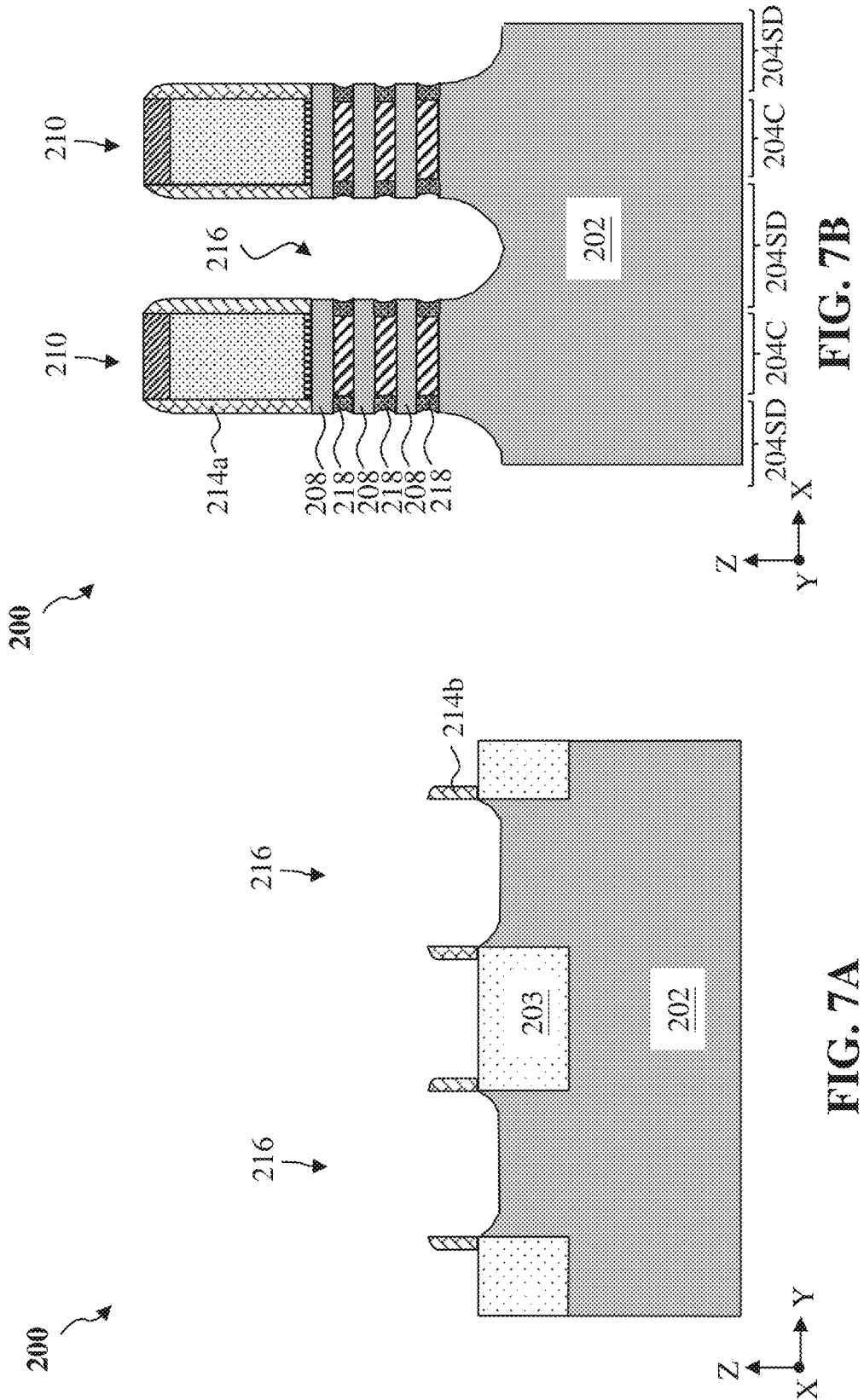

Referring to FIGS. 1, 7A, and 7B, method 100 includes a block 110 where inner spacer features 218 are formed. After the formation of the source/drain openings 216, the sacrificial layers 206 are exposed in the source/drain openings 216 and then selectively and partially recessed to form inner spacer recesses, while the exposed channel layers 208 are substantially unetched. In embodiments where the channel layers 208 consist essentially of silicon (Si) and sacrificial layers 206 consist essentially of silicon germanium (SiGe), the selective and partial recess of the sacrificial layers 206 may include use of a selective isotropic etching process (e.g., a selective dry etching process or a selective wet etching process), and the extent at which the sacrificial layers 206 are recessed is controlled by duration of the etching process. A dielectric layer may be then conformally deposited over the workpiece 200, including in the inner spacer recesses, by ALD, CVD, or any other suitable deposition processes. The term "conformally" may be used herein for ease of description of a layer having substantially uniform thickness over various regions of the workpiece 200. The dielectric layer may be then etched back to form the inner spacer features 218. The dielectric layer may include silicon oxide, silicon nitride, silicon oxycarbide, silicon oxycarbonitride, silicon carbonitride, metal nitride, or a suitable dielectric material.

Figures 8A, 8B:
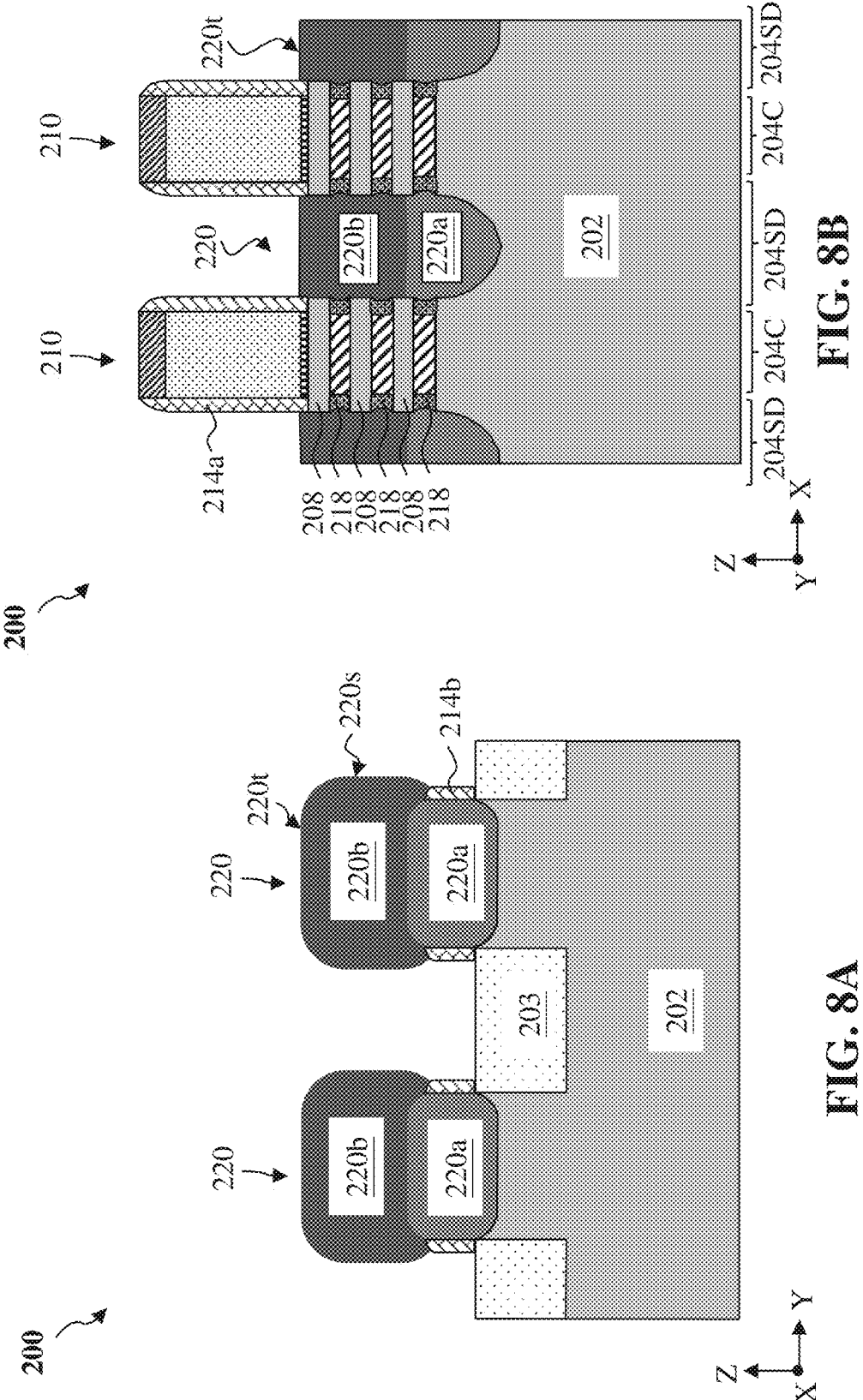

Referring to FIGS. 1, 8A, and 8B, method 100 includes a block 112 where source/drain features 220 are formed in the source/drain openings 216. Source/drain feature(s) may refer to a source or a drain, individually or collectively dependent upon the context. In this illustrated example, the source/drain feature 220 includes a second epitaxial semiconductor layer 220b over a first epitaxial semiconductor layer 220a. A concentration of dopants in the second epitaxial semiconductor layer 220b is greater than a concentration of dopants in the first epitaxial semiconductor layer 220a. In some embodiments, the source/drain feature 220 may include an undoped epitaxial layer formed under the first epitaxial semiconductor layer 220a. The source/drain feature 220 includes a top surface 220t and sidewall surfaces. Portions of the sidewall surfaces that are not covered by the fin sidewall spacers 214b may be referred to as sidewall surfaces 220s.

Depending on the conductivity type of the to-be-formed transistor, the source/drain features 220 may be n-type source/drain features 220 or p-type source/drain features 220. Exemplary n-type source/drain features 220 may include silicon, phosphorus-doped silicon, arsenic-doped silicon, antimony-doped silicon, or other suitable materials (e.g., SiC, SiCP, SiCAs) and may be in-situ doped during the epitaxial process by introducing an n-type dopant, such as phosphorus, arsenic, or antimony, or ex-situ doped using a junction implant process. A concentration of dopants of the first epitaxial semiconductor layer 220a in n-type source/drain features may be between about 2E20 atoms/cm$^{-3}$ and about 1E21 atoms/cm$^{-3}$, and a concentration of dopants of the second epitaxial semiconductor layer 220b in n-type source/drain features may be between about 5E20 atoms/cm$^{-3}$ and about 4E21 atoms/cm$^{-3}$. In some embodiments, the atomic percentage (at. %) of carbon dopant in the first epitaxial semiconductor layer 220a of the n-type source/drain features may be less than about 10 at. %, and the atomic percentage (at. %) of carbon dopant in the second epitaxial semiconductor layer 220b of the n-type source/drain features may be less than about 20 at. %. Exemplary p-type source/drain features may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process. A dopant concentration of the first epitaxial semiconductor layer 220a in the p-type source/drain features may be between about 1E20 atoms/cm$^{-3}$ and about 5E20 atoms/cm$^{-3}$, and a dopant concentration of the second epitaxial semiconductor layer 220b in the p-type source/drain features may be between about 4E20 atoms/cm$^{-3}$ and about 2E21 atoms/cm$^{-3}$. In some embodiments, the atomic percentage (at. %) of germanium dopant in the first epitaxial semiconductor layer 220a of p-type source/drain features may be less than about 20 at. %, and the atomic percentage (at. %) of germanium dopant in the second epitaxial semiconductor layer 220b of p-type source/drain features may be greater than about 10 at. % and less than about 60 at. %.

Figures 9A, 9B:
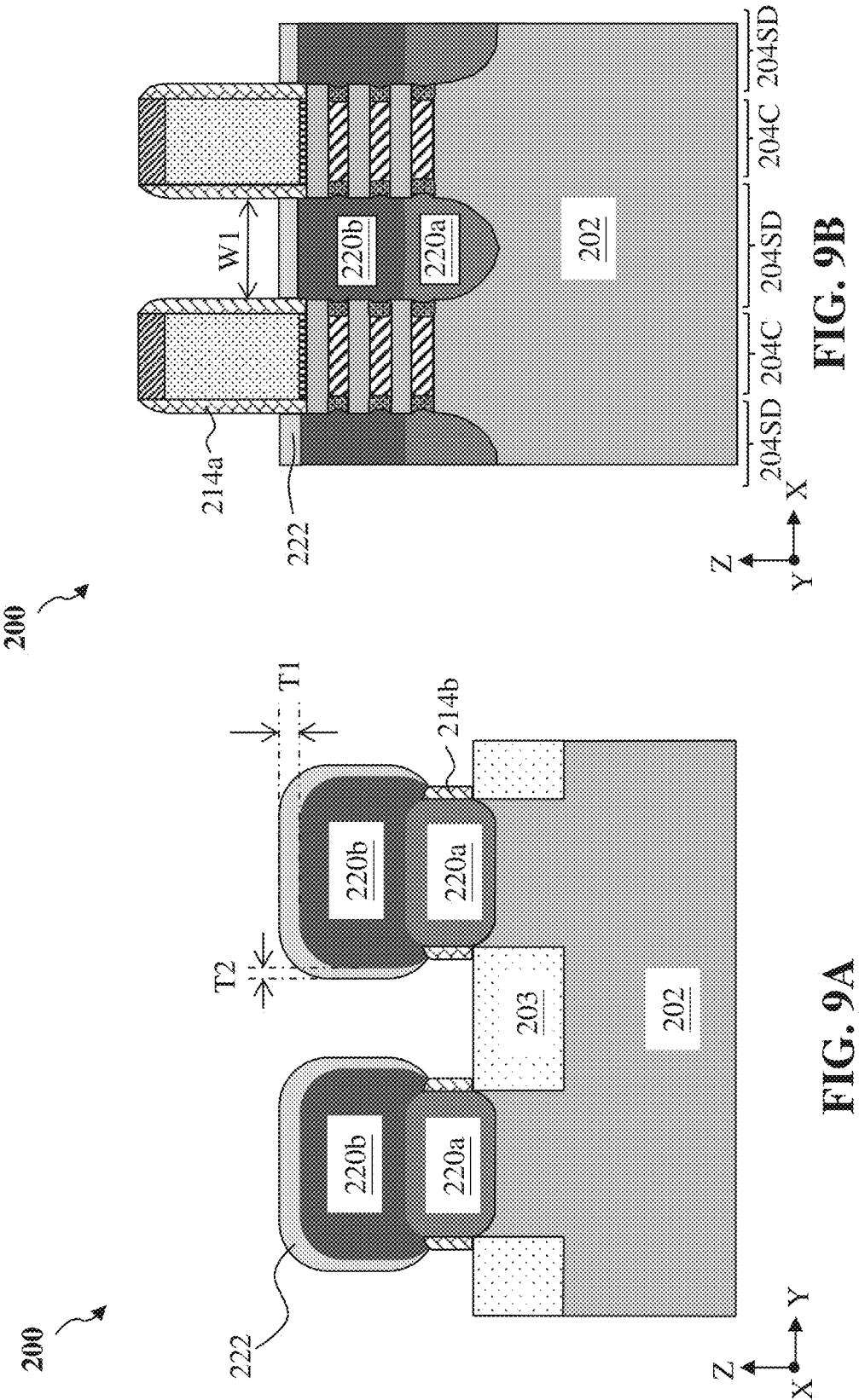
Figures 10A, 10B:
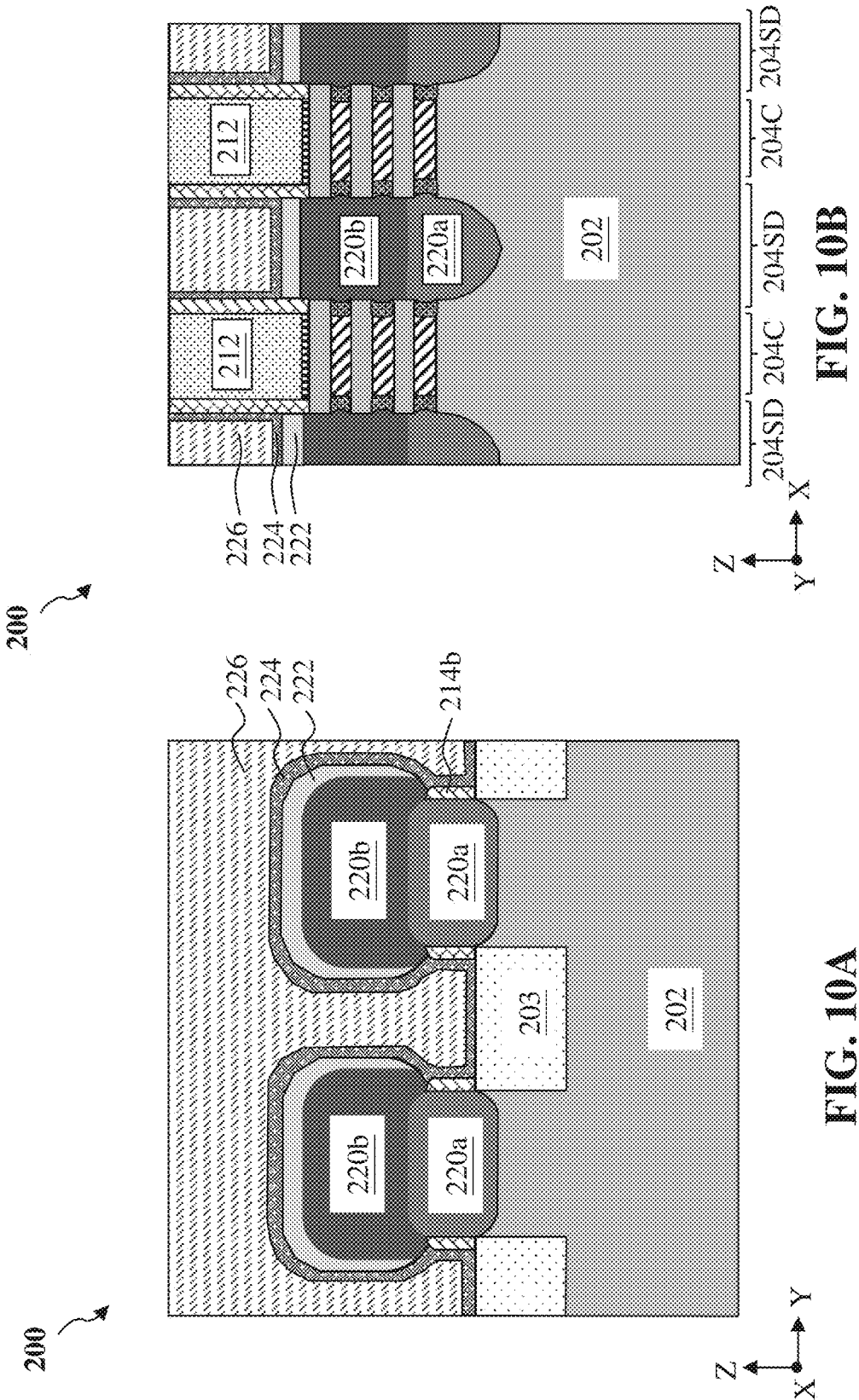

Referring to FIGS. 1, 9A, and 9B, method 100 includes a block 114 where a dummy layer 222 is selectively formed on more than one side of the source/drain feature 220. In embodiments presented in FIG. 9A, the dummy layer 222 is formed on the top surface 220t (shown in FIGS. 8A and 8B) and sidewall surfaces 220s (shown in FIG. 8A) of the source/drain feature 220. A composition of the dummy layer 222 is different than a composition of the second epitaxial semiconductor layer 220b such that the dummy layer 222 may be selectively removed in a subsequent etching process. For transistors having n-type source/drain features 220, the dummy layer 222 may include SiGe, Ge, SiSn, SiGeSn, other suitable materials, or combinations thereof. In an embodiment, the dummy layer 222 of n-type transistors includes SiGe. For transistors having p-type source/drain features 220, the dummy layer 222 may include Si, SiC, SiB, other suitable materials, or combinations thereof. In an embodiment, the dummy layer 222 of p-type transistors includes Si.

The dummy layer 222 may be formed by a deposition process that selectively grows, for example, a semiconductor layer (e.g., SiGe for n-type transistors or Si for p-type transistors) on the source/drain feature 220 without growing on sidewall surfaces of the fin sidewall spacers 214b or the top surface of the isolation feature 203. That is, the fin sidewall spacers 214b constrains the formation of the dummy layer 222. In the present embodiments, the dummy layer 222 is formed on more than one side of the second epitaxial semiconductor layer 220b. That is, the dummy layer 222 partially wraps around or surrounds the second epitaxial semiconductor layer 220b. Formation of the dummy layer 222 may include use of an epitaxial growth process, such as molecular beam epitaxy (MBE), VPE, UHV-CVD, and/or other suitable epitaxial growth processes. The epitaxial growth process can use gaseous and/or liquid precursors. In some embodiments, due different growth rates along the X direction and the Y direction, after the epitaxial growth process, the dummy layer 222 may have an ununiform thickness along the sidewall surfaces 220s and top surface 220t of the source/drain feature 220. In embodiments represented by FIGS. 9A and 9B, the dummy layer 222 has a thickness T1 on the top surface 220t of the source/drain feature 220 and has a thickness T2 on the sidewall surface 220s of the source/drain feature 220. A ratio of the thickness T2 to the thickness T1 may be between about 0.4 and 1. In some embodiments, due to the presence of the fin sidewall spacers 214b, the thickness T2 is not uniform from bottom to the top. In an embodiment, as represented by FIG. 9B, along the X direction, a width W1 of the dummy layer 222 is the same as a width of the source/drain feature 220.

Referring to FIGS. 1, 10A, 10B, 11A and 11B, method 100 includes a block 116 where the dummy gate structures 210 and the sacrificial layers 206 are selectively removed in a sequential order. In embodiments represented in FIGS. 10A and 10B, a contact etch stop layer (CESL) 224 and an interlayer dielectric layer (ILD) layer 226 are deposited over the workpiece 200. The CESL 224 is spaced apart from the second epitaxial semiconductor layer 220b by the dummy layer 222. The CESL 224 may include silicon nitride, silicon oxynitride, and/or other materials known in the art and may be formed by ALD, plasma-enhanced chemical vapor deposition (PECVD) process and/or other suitable deposition or oxidation processes. The ILD layer 226 is deposited by a PECVD process or other suitable deposition technique over the workpiece 200 after the deposition of the CESL 224. The ILD layer 226 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A planarization process, such a chemical mechanical polishing (CMP) process may be performed to the workpiece 200 to remove excess materials and expose top surfaces of the dummy gate electrode layers 212 in the dummy gate structures 210.

Figures 11A, 11B:
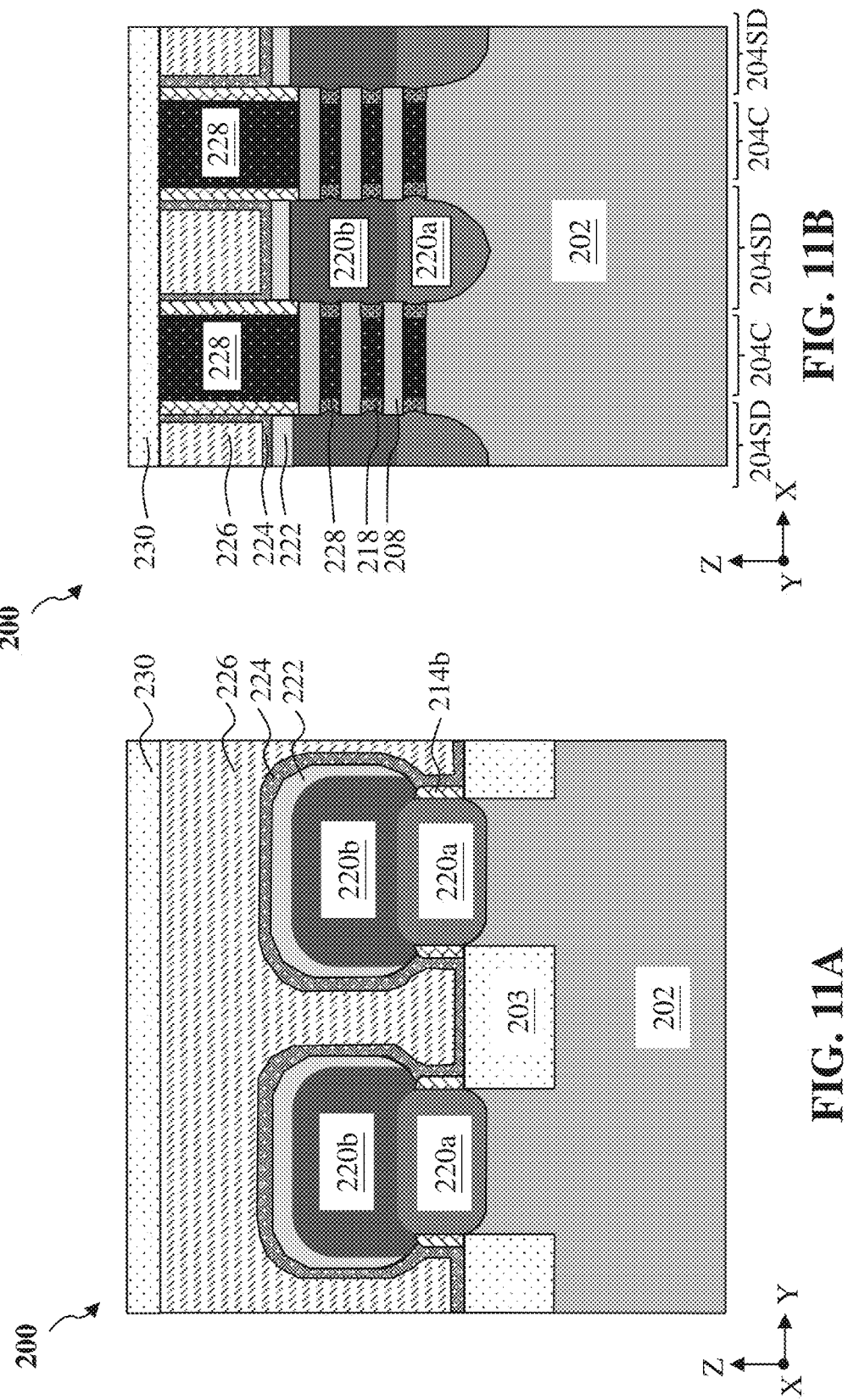

With the exposure of the dummy gate electrode layers 212, block 116 proceeds to removal of the dummy gate structures 210. As represented by FIGS. 11A and 11B, the removal of the dummy gate structures 210 may include performing one or more etching process selective to the materials in the dummy gate structures 210 to form a number of gate trenches. For example, the removal of the dummy gate structures 210 may be performed using a selective wet etch, a selective dry etch, or a combination thereof. After the removal of the dummy gate structures 210, the sacrificial layers 206 are selectively removed to release the channel layers 208 as channel members 208 in the channel regions 204C. The selective removal of the sacrificial layers 206 may be implemented by a selective dry etch, a selective wet etch, or other selective etching process. In some embodiments, the selective wet etching includes an APM etch (e.g., ammonia hydroxide-hydrogen peroxide-water mixture). The selective removal of the number of sacrificial layers 206 forms a number of gate openings.

With the selective removal of the dummy gate structures 210 and sacrificial layers 206, block 118 proceeds to formation of gate stacks 228. In embodiments represented by FIGS. 11A and 11B, the gate stacks 228 are deposited to wrap around the channel members 208 and over the channel members 208. That is, the gate stacks 228 are formed in the gate openings and the gate trenches. Although not separately labeled, each of the gate stacks 228 may include a gate dielectric layer and a gate electrode layer over the gate dielectric layer. In some embodiments, the gate dielectric layer includes an interfacial layer disposed on the channel members 208 and a high-k dielectric layer over the interfacial layer. Here, a high-k dielectric layer refers to a dielectric material having a dielectric constant greater than that of silicon dioxide, which is about 3.9. In some embodiments, the interfacial layer includes silicon oxide. The high-k dielectric layer is then deposited over the interfacial layer using ALD, CVD, and/or other suitable methods. The high-k dielectric layer may include hafnium oxide. Alternatively, the high-k dielectric layer may include other high-k dielectrics, such as titanium oxide, hafnium zirconium oxide, tantalum oxide, hafnium silicon oxide, zirconium silicon oxide, lanthanum oxide, aluminum oxide, yttrium oxide, $SrTiO_3$, $BaTiO_3$, BaZrO, hafnium lanthanum oxide, lanthanum silicon oxide, aluminum silicon oxide, hafnium tantalum oxide, hafnium titanium oxide, $(Ba,Sr)TiO_3$ (BST), silicon nitride, silicon oxynitride, combinations thereof, or other suitable material.

The gate electrode layer is then deposited over the gate dielectric layer using ALD, physical vapor deposition (PVD), CVD, e-beam evaporation, or other suitable methods. The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride, titanium aluminum, titanium aluminum nitride, tantalum nitride, tantalum aluminum, tantalum aluminum nitride, tantalum aluminum carbide, tantalum carbonitride, aluminum, tungsten, nickel, titanium, ruthenium, cobalt, platinum, tantalum carbide, tantalum silicon nitride, copper, other refractory metals, or other suitable metal materials or a combination thereof. Further, where the semiconductor device 200 includes n-type transistors and p-type transistors, different gate electrode layers may be formed separately for n-type transistors and p-type transistors, which may include different work function metal layers (e.g., for providing different n-type and p-type work function metal layers). In some embodiments, after forming the gate stacks 228, a dielectric layer 230 is formed over the workpiece 200. A composition of the dielectric layer 230 may be in a way similar to that of the ILD layer 226. In some other embodiments, after forming the gate stacks 228, the gate stacks 228 may be recessed and a self-aligned cap layer may be formed on the recessed gate stack 228.

Figures 12A, 12B:
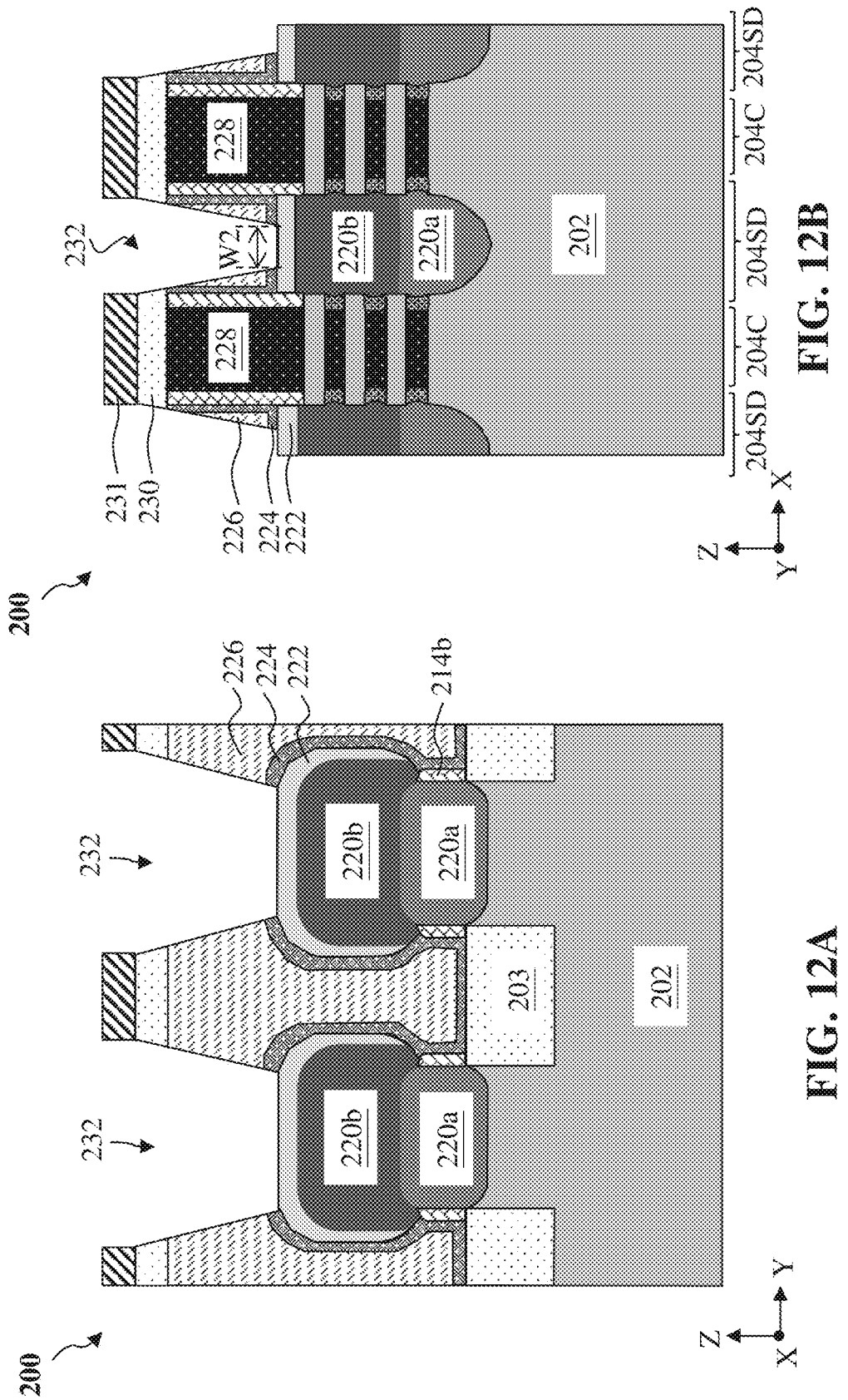

Referring to FIGS. 1, 12A, and 12B, method 100 includes a block 120 where a source/drain contact opening 232 is formed. A patterned hard mask 231 may be formed on the top surface of the dielectric layer 230, and an etching process may be then conducted to remove portions of the dielectric layer 230, the ILD layer 226, and the CESL 224 not covered by the patterned hard mask 231 to form source/drain contact openings 232. The source/drain contact opening 232 exposes a portion of a top surface of the dummy layer 222. In some embodiments, the portion of the dummy layer 222 exposed by the source/drain contact opening 232 has a width W2 along the X direction, the width W2 is smaller than the width W1 (shown in FIG. 9B).

Figures 13A, 13B:
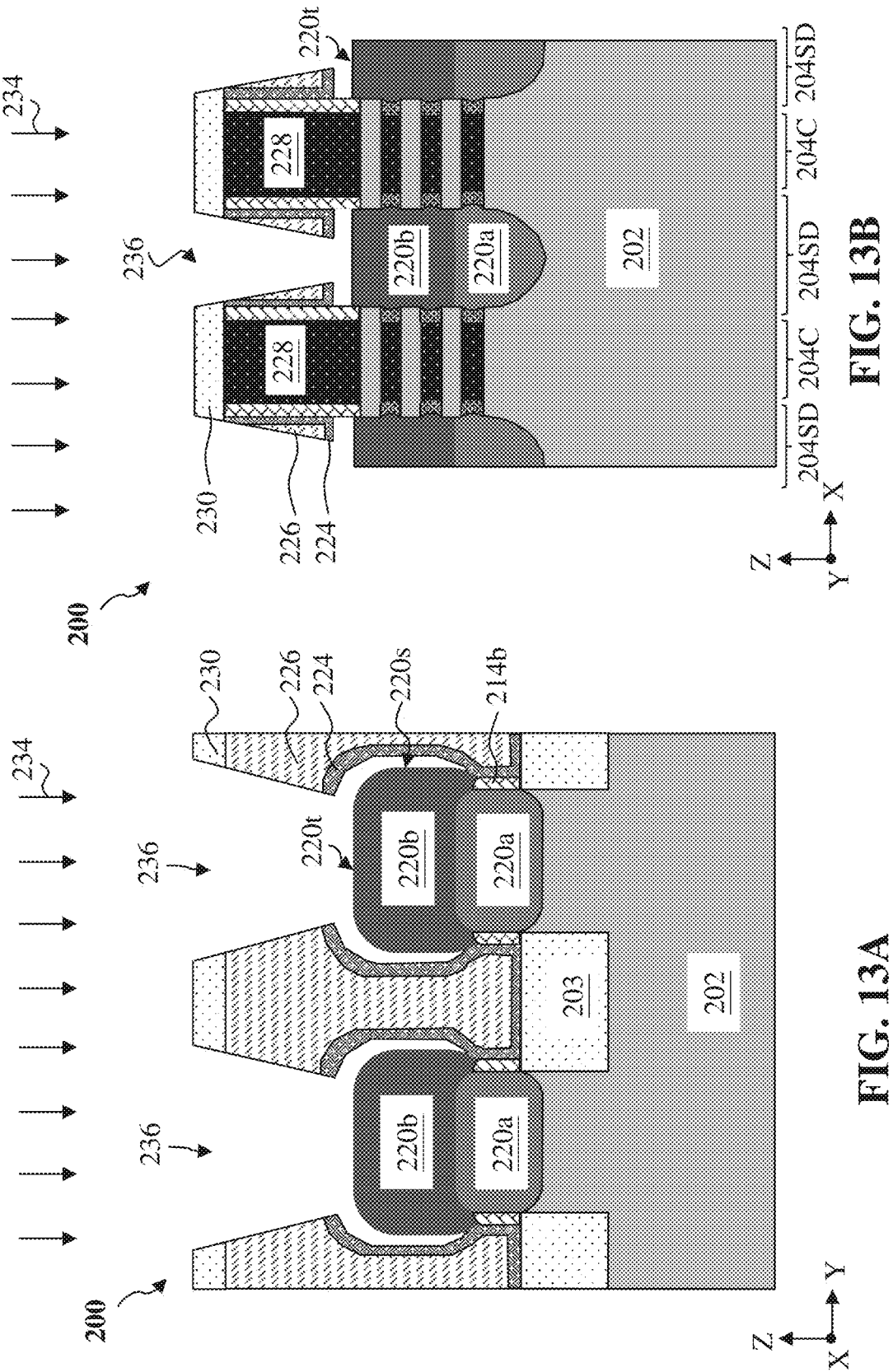

Referring to FIGS. 1, 13A, and 13B, method 100 includes a block 122 where the dummy layer 222 is selectively removed to expose the top surface and sidewall surfaces of the source/drain feature 220. In the present embodiment, an etching process 234 is performed to selectively remove the dummy layer 222 without substantially etching the source/drain feature 220, the dielectric layer 230, the ILD layer 226, and the CESL 224. In an embodiment, the etching process 234 is an isotropic etching process and may be a dry etch or a wet etch. An exemplary dry etch may implement a combination of a fluorine-containing gas (e.g., $F_2$) and ammonia ($NH_3$). An exemplary wet etch may implement a SC1 solution ($NH_4OH{:}H_2O_2{:}H_2O$). Other suitable etchants are possible. The removal of the dummy layer 222 enlarges the source/drain contact opening 232. The enlarged source/drain contact opening 232 may be referred to as a source/drain contact opening 236. As illustrated in FIGS. 13A and 13B, after the selective removal of the dummy layer 222, sidewall surfaces 220s and top surface 220t of the source/drain feature 220 are exposed in the source/drain contact opening 236.

Figures 14A, 14B:
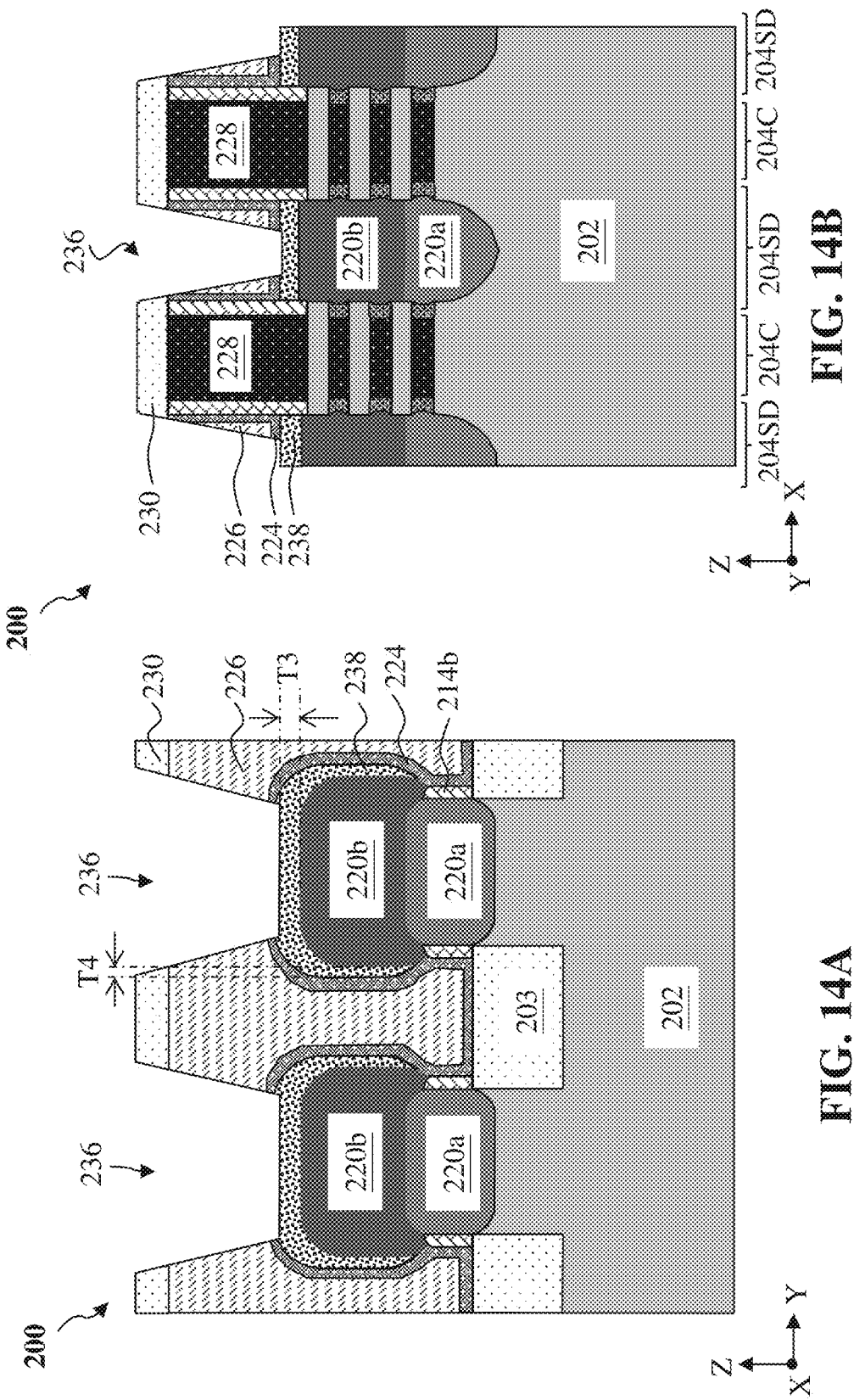

Referring to FIGS. 1, 14A, and 14B, method 100 includes a block 124 where a silicide layer 238 is formed on more than one sides of the source/drain feature 220. In the present embodiments, the silicide layer 238 is formed on the top surface 220t and sidewall surfaces 220s of the second epitaxial semiconductor layer 220b of the source/drain feature 220. Compared with embodiments where the silicide layer is formed only on the top surface of the source/drain feature, a contact area between the silicide layer and the source/drain feature of the present embodiment is increased, and thus a contact resistance of the workpiece 200 is advantageously reduced, thereby improving the performance of the workpiece 200.

To form the silicide layer 238, a metal layer is deposited (by ALD, CVD and/or other deposition processes) over the workpiece 200, including on the exposed top surface 220t and sidewall surfaces 220s of the second epitaxial semiconductor layer 220b, and an anneal process is then performed to bring about silicidation reaction between the metal layer and the second epitaxial semiconductor layer 220b of the source/drain feature 220. The anneal process may include a rapid thermal annealing (RTA) process that is performed between 600° C. and 950° C. or a dynamic surface annealing (DSA) process that is performed between about 750° C. and 1000° C. Other anneal process such as an ultra sub-second annealing (uSSA) or a laser spike annealing (LSA) may also be possible. Excess portions of the metal layer that does not form the silicide layer 238 may be removed. Suitable metal layer may include titanium, tantalum, nickel, cobalt, or tungsten. In embodiments where the metal layer includes nickel and the source/drain feature 220 includes silicon germanium, the silicide layer 238 includes nickel silicide, nickel germanide, and nickel germanosilicide. In some other embodiments, the silicide layer 238 may include titanium silicide, tantalum silicide, cobalt silicide, or tungsten silicide. The silicide layer 238 generally tracks the shape of the exposed top surface 220t and sidewall surfaces 220s. That is, after the dummy layer 222 being replaced by the silicide layer 238, the silicide layer 238 wraps around more than one side of the source/drain feature 220. In an embodiment, the silicide layer 238 includes a first portion formed on the sidewall surfaces 220s of the source/drain feature 220 and a second portion formed on the top surface 220t of the source/drain feature 220, and a thickness T4 of the first portion of the silicide layer 238 is different than a thickness T3 of the second portion of the silicide layer 238. In an embodiment, a ratio of the thickness T4 of the first portion of the silicide layer 238 to the thickness T3 of the second portion of the silicide layer 238 may be between about 0.4 and about 1. In an embodiment represented by FIG. 14A, the thickness T4 of the first portion of the silicide layer 238 is not uniform from bottom to top. More specifically, a thickness of a part of the first portion of the silicide layer 238 that is near the fin sidewall spacers 214b is less than a thickness of a remaining part of the first portion of the silicide layer 238. In an embodiment represented by FIG. 14B, along the X direction, a width of the silicide layer 238 is substantially equal to the width W1 of the dummy layer 222 and thus equal to the width of the source/drain feature 220.

Figures 15A, 15B:
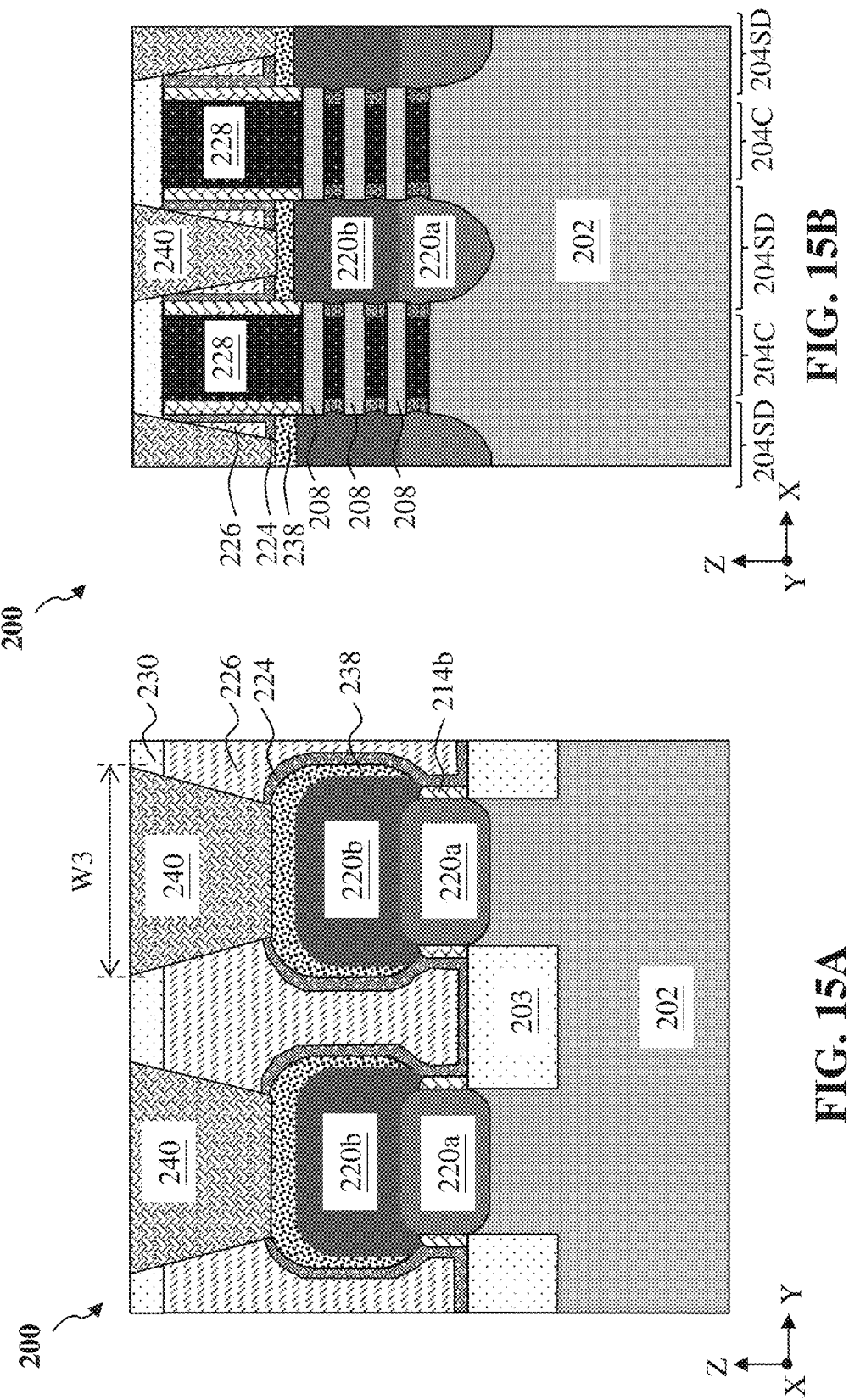
Figure 16:
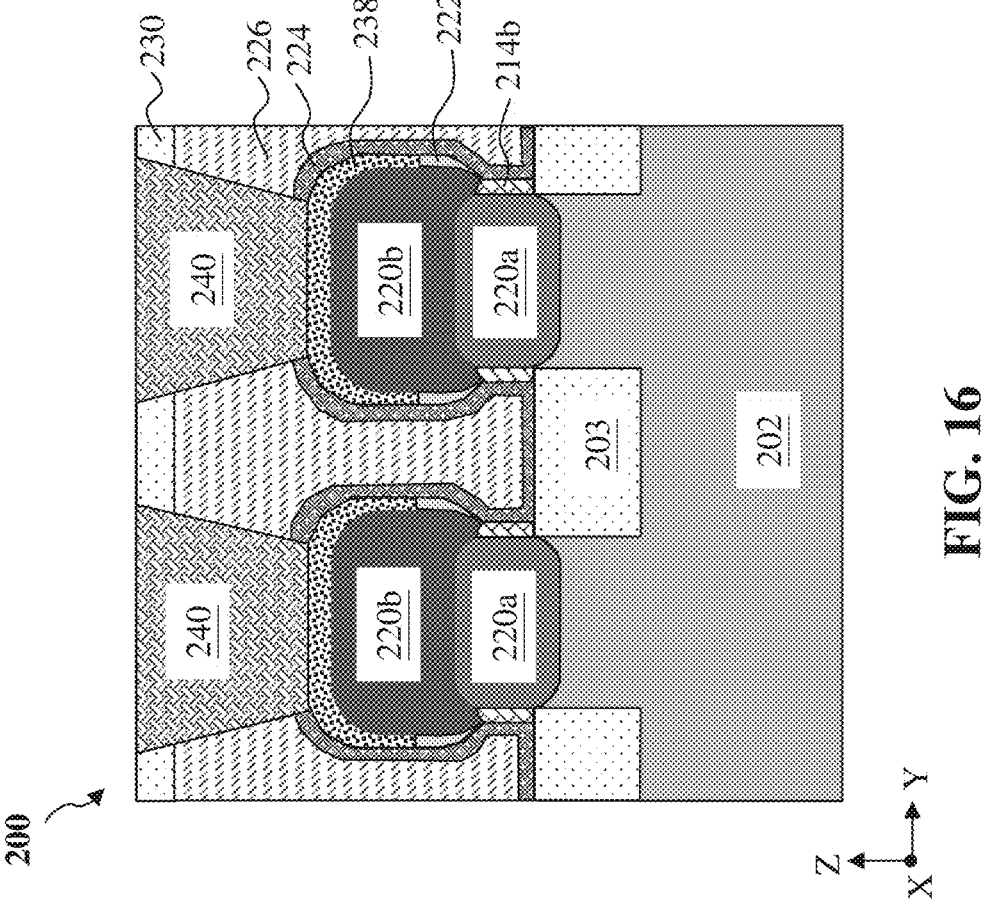
FIG. 16 illustrates a fragmentary cross-sectional view of a first alternative semiconductor device, according to various aspects of the present disclosure.
Figure 17:
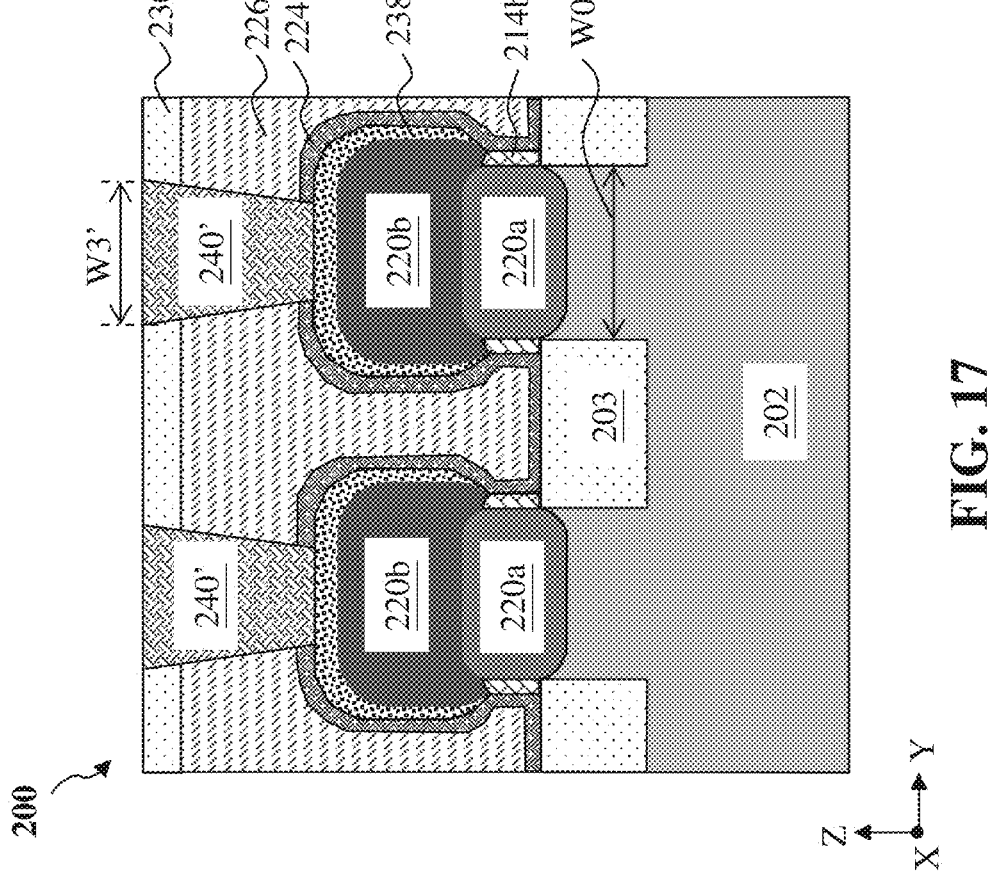
FIG. 17 illustrates a fragmentary cross-sectional view of a second alternative semiconductor device, according to various aspects of the present disclosure.

Referring to FIGS. 1, 15A, and 15B, method 100 includes a block 126 where a source/drain contact 240 is formed in the source/drain contact opening 236 and over the silicide layer 238. After the formation of the silicide layer 238, a conductive layer may be deposited over the workpiece 200 to fill the source/drain contact opening 236. The conductive layer may include aluminum, rhodium, ruthenium, copper, iridium, or tungsten. A planarization process, such as a CMP process, may be followed to remove excess portions of the conductive layer, thereby forming the source/drain contact 240. The source/drain contact 240 is electrically coupled to the source/drain feature 220 by way of the silicide layer 238. In other words, the second portion of the silicide layer 238 is vertically sandwiched between the source/drain feature 220 and the source/drain contact 240, and the first portion of the silicide layer 238 is laterally sandwiched between the source/drain feature 220 and the CESL 224. After the planarization process, as represented by FIG. 15A, a top surface of the source/drain contact 240 spans a width W3 along the X direction. The width W3 may be substantially equal to a width of the second epitaxial semiconductor layer 220b of the source/drain feature 220. The source/drain contact 240 generally tracks the shape of the source/drain contact opening 236. As represented by FIG. 15B, along the Y direction, a bottom surface of the source/drain contact 240 spans the width W2 (shown in FIG. 12B). In an embodiment, the width W2 is less than the width (i.e., W1) of the silicide layer 238.

Referring to FIG. 1, method 100 includes a block 128 where further processes are performed. Such further processes may include forming a multi-layer interconnect (MLI) structure (not depicted) over the workpiece 200. The MLI may include various interconnect features, such as vias and conductive lines, disposed in dielectric layers, such as etch-stop layers and ILD layers. In some embodiments, the vias are vertical interconnect features configured to interconnect device-level contacts, such as gate contacts (not depicted) formed over the gate stack 228.

In the above embodiments, the etching process 234 (shown in FIGS. 13A and 13B) substantially removes the dummy layer 222. In some other embodiments, due to insufficient duration of the etching process 234, a bottom portion of the dummy layer 222 near the fin sidewall spacer 214b may remain in the workpiece 200 after the etching process 234. For example, in embodiments represented in FIG. 16, the workpiece 200 includes a portion of the dummy layer 222 disposed laterally adjacent to the source/drain feature 220 and laterally sandwiched between the source/drain feature 220 and the CESL 224. In some embodiments, the metal layer that is used to facilitate the formation of the silicide layer may react with a top surface of the remaining portion of the dummy layer 222.

In some embodiments, to reduce a parasitic capacitance of the workpiece 200, a width of the source/drain contact 240 along the Y direction may be reduced. For example, the workpiece 200 shown in FIG. 17 includes a source/drain contact 240' that has a width W3' that is less than the width W3. A ratio of the width W3' to a width W0 of the active region 204 may be between about 0.2 and about 0.8. In some embodiments, the workpiece 200 with a smaller source/drain contact 240' may be applied in, for example, high density static random-access memory (SRAM) cells.

Figure 18:
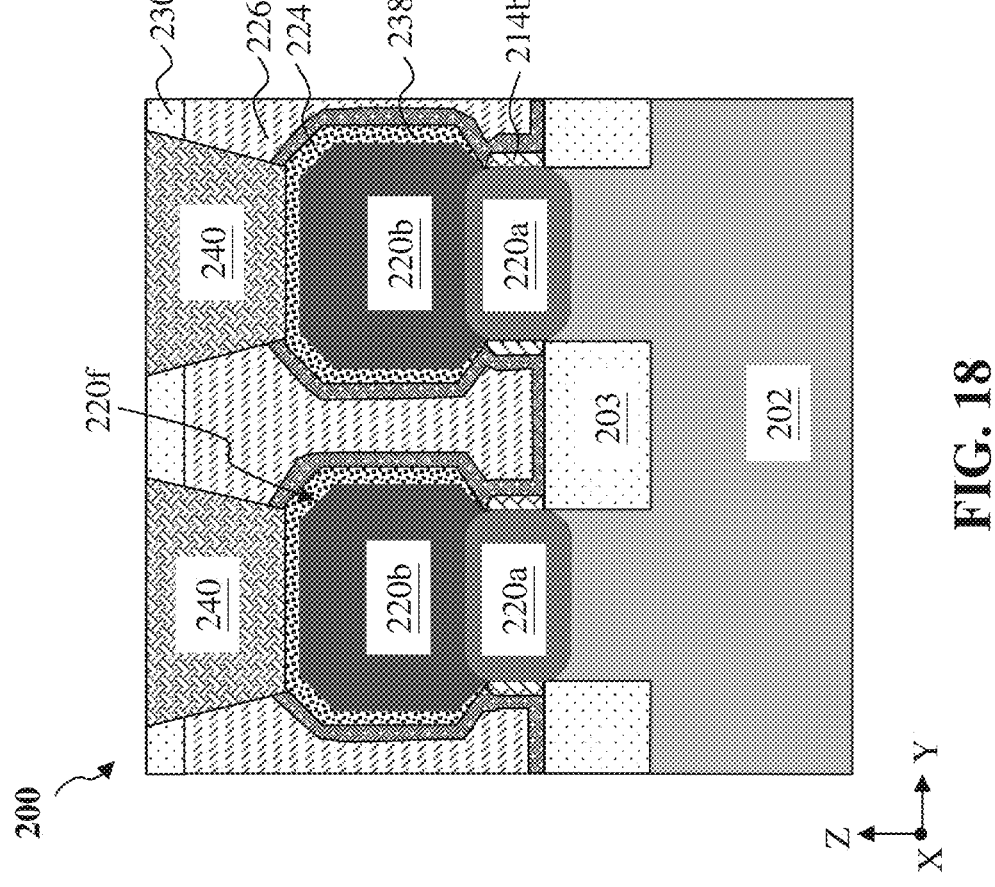
FIG. 18 illustrates a fragmentary cross-sectional view of a third alternative semiconductor device, according to various aspects of the present disclosure.

In some other embodiments, due to different conditions/parameters associated with the epitaxial growth process for forming the second epitaxial semiconductor layer 220b of the source/drain feature 220, the second epitaxial semiconductor layer 220b may include a (111) facet, as represented in FIG. 18. The dummy layer 222 that is formed on the second epitaxial semiconductor layer 220b may also include a corresponding (111) facet. After the dummy layer 222 being replaced by the silicide layer 238, a surface 220f of the silicide layer 238 may also include a (111) facet.

Although not intended to be limiting, one or more embodiments of the present disclosure provide many benefits to a semiconductor device and the formation thereof. The present disclosure provides methods and structures that can provide multi-gate devices (e.g., such as a GAA transistors) having a source/drain feature and a silicide layer formed on more than one side of the source/drain feature, thereby reducing a parasitic resistance of the semiconductor device. In some embodiments, a dimension of a source/drain contact formed over the silicide layer may be decreased to reduce a parasitic capacitance of the semiconductor device. In some embodiments, the enlarged silicide layer may reduce the travel length of current (e.g., carriers, such as electrons or holes) in the source/drain feature and thus increase the operation speed of GAA transistors having multiple nanostructures. In some embodiments, methods of the present disclosure may be readily incorporated into the formation of silicide layers in FinFETs.

The present disclosure provides for many different embodiments. Semiconductor devices and methods of fabrication thereof are disclosed herein. In one exemplary aspect, the present disclosure is directed to a method. The method includes receiving a workpiece comprising a channel region protruding from a substrate, a dummy gate structure over the channel region, and a source/drain feature coupled to the channel region. The method also includes forming a dummy layer to wrap around the source/drain feature, after the forming of the dummy layer, forming a dielectric structure over the workpiece, selectively removing the dummy gate structure to form a gate trench, forming a gate stack in the gate trench, after the forming of the gate stack in the gate trench, forming a metal contact opening extending through the dielectric structure and exposing the dummy layer, replacing the dummy layer with a silicide layer, and forming a metal contact in the metal contact opening, the metal contact is electrically coupled to the source/drain feature via the silicide layer.

In some embodiments, the channel region may include a plurality of alternating channel layers and sacrificial layers. The method may also include, after the selectively removing the dummy gate structure, selectively removing the sacrificial layers to form gate openings, where the gate stack may be further formed in the gate openings and wraps around each channel layer of the plurality of channel layers. In some embodiments, the replacing the dummy layer with the silicide layer may include performing an etching process to selectively remove the dummy layer to form an air gap around the source/drain feature, and forming the silicide layer in the air gap to wrap around the source/drain feature. In some embodiments, the etching process may include an isotropic etching process. In some embodiments, the forming of the silicide layer may include, after the performing of the etching process, forming a conductive layer over the workpiece, performing an anneal process to the workpiece to form the silicide layer, and removing a remaining portion of the conductive layer. In some embodiments, the forming of the dielectric structure may include depositing an etch stop layer and forming a dielectric layer on the etch stop layer, where a portion of a sidewall surface of the silicide layer is in direct contact with a portion of a sidewall surface of the etch stop layer. In some embodiments, the source/drain feature may include silicon germanium, and the dummy layer may include silicon. In some embodiments, the silicide layer may include a first portion formed on a sidewall surface of the source/drain feature and a second portion formed on a top surface of the source/drain feature, a thickness of the first portion may be different than a thickness of the second portion. In some embodiments, the source/drain feature may include a first semiconductor layer and a second semiconductor layer formed on the first semiconductor layer, a dopant concentration of the second semiconductor layer may be greater than a dopant concentration of the first semiconductor layer. In some embodiments, the workpiece may also include a fin sidewall spacer extending along a sidewall surface of the first semiconductor layer, where the silicide layer may be formed on a sidewall surface of the second semiconductor layer.

In another exemplary aspect, the present disclosure is directed to a method. The method includes receiving a workpiece comprising a dummy gate structure formed over a channel region, the channel region comprising a plurality of channel layers interleaved by a plurality of sacrificial layers, and a source/drain feature disposed adjacent to the channel region and coupled to the channel region. The method also includes forming a semiconductor layer on sidewall and top surfaces of the source/drain feature, wherein a composition of the semiconductor layer is different than a composition of the source/drain feature, after the forming of the semiconductor layer, selectively removing the dummy gate structure, selectively removing the plurality of sacrificial layers, forming a gate stack to wrap around and over the plurality of channel layers, after the forming of the gate stack, forming a first opening exposing the semiconductor layer, after the forming of the first opening, selectively removing the semiconductor layer to form a second opening to expose the source/drain feature, forming a silicide layer in the second opening, and forming a metal contact in the first opening.

In some embodiments, the forming of the semiconductor layer may include performing an epitaxial growth process. In some embodiments, the source/drain feature may include a first epitaxial layer and a second epitaxial layer formed on the first epitaxial layer, where a concentration of dopants in the second epitaxial layer may be greater than a concentration of dopants in the first epitaxial layer. In some embodiments, the semiconductor layer may include a first portion on the sidewall surface of the second epitaxial layer and a second portion on the top surface of the second epitaxial layer, where a thickness of the first portion may be different than a thickness of the second portion. In some embodiments, the selectively removing of the semiconductor layer may include performing an isotropic etching process to selectively remove the semiconductor layer without substantially etching the source/drain feature. In some embodiments, the method may also include, after the forming of the semiconductor layer, forming an etch stop layer over the source/drain feature, and forming an interlayer dielectric (ILD) layer over the etch stop layer, where the forming of the first opening may include removing portions of the etch stop layer and the ILD layer to expose a portion of the semiconductor layer.

In yet another exemplary aspect, the present disclosure is directed to a semiconductor device. The semiconductor device includes a vertical stack of channel members disposed over a substrate, a gate structure wrapping around each channel member of the vertical stack of channel members, a source/drain feature electrically coupled to the vertical stack of channel members, where the source/drain feature is disposed adjacent to the vertical stack of channel members, a silicide layer over and wrapping around the source/drain feature, and a metal contact disposed over the source/drain feature and electrically coupled to the source/drain feature via the silicide layer, where the metal contact includes a bottom surface spans a first width, and a top surface of the silicide layer spans a second width greater than the first width.

In some embodiments, the semiconductor device may also include a fin sidewall spacer extending along a bottom portion of a sidewall surface of the source/drain feature, and a semiconductor layer extending along a middle portion of the sidewall surface of the source/drain feature. A composition of the semiconductor layer may be different than a composition of the source/drain feature. The silicide layer may be formed on a top surface of the source/drain feature and extending along a remaining portion of the sidewall surface of the source/drain feature. In some embodiments, the semiconductor device may also include a fin sidewall spacer extending along a bottom portion of a sidewall surface of the source/drain feature, where the silicide layer may be formed on a top surface of the source/drain feature and extending along a remaining portion of the sidewall surface of the source/drain feature not covered by the fin sidewall spacer. In some embodiments, the silicide layer may include a first portion disposed on a top surface of the source/drain feature and a second portion disposed along a sidewall surface of the source/drain feature, a thickness of the first portion of the silicide layer may be different than a thickness of the second portion of the silicide layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
  receiving a workpiece comprising:
    a channel region protruding from a substrate,
    a dummy gate structure over the channel region,
    a source/drain feature coupled to the channel region, and
    a fin sidewall spacer disposed adjacent to a lower portion of the source/drain feature;
  forming a dummy layer to wrap around an upper portion of the source/drain feature without being formed on the fin sidewall spacer;
  after the forming of the dummy layer, forming a dielectric structure over the workpiece;
  selectively removing the dummy gate structure to form a gate trench;
  forming a gate stack in the gate trench;
  after the forming of the gate stack in the gate trench, forming a metal contact opening extending through the dielectric structure and exposing the dummy layer;
  after the forming of the metal contact opening, replacing the dummy layer with a silicide layer, wherein the silicide layer comprises a first portion formed on a sidewall surface of the source/drain feature and a second portion formed on a top surface of the source/drain feature, a thickness of the first portion is different than a thickness of the second portion; and
  forming a metal contact in the metal contact opening, wherein the metal contact is electrically coupled to the source/drain feature via the silicide layer.

2. The method of claim 1, wherein the channel region comprises a base fin protruding from the substrate and a plurality of channel layers interleaved by a plurality of sacrificial layers over the base fin.

3. The method of claim 2, further comprising:
  after the selectively removing of the dummy gate structure, selectively removing the plurality of sacrificial layers to form gate openings,
  wherein the gate stack is further formed in the gate openings and wraps around each channel layer of the plurality of channel layers.

4. The method of claim 3, wherein the replacing of the dummy layer with the silicide layer comprises:
  performing an etching process to selectively remove the dummy layer to form a gap, the gap exposing a top surface and at least a portion of a sidewall surface of the source/drain feature; and
  forming the silicide layer in the gap to wrap around the upper portion of the source/drain feature.

5. The method of claim 4, wherein the etching process comprises an isotropic etching process.

6. The method of claim 4, wherein the forming of the silicide layer comprises:
  after the performing of the etching process, forming a conductive layer over the workpiece;

performing an anneal process to the workpiece to form the silicide layer; and removing a remaining portion of the conductive layer.

7. The method of claim 1, wherein the forming of the dielectric structure comprises:

depositing an etch stop layer; and forming a dielectric layer on the etch stop layer, wherein a portion of a sidewall surface of the silicide layer is in direct contact with a portion of a sidewall surface of the etch stop layer.

8. The method of claim 1, wherein the source/drain feature comprises silicon germanium, and the dummy layer comprises silicon.

9. The method of claim 1, wherein the source/drain feature comprises a first semiconductor layer and a second semiconductor layer formed on the first semiconductor layer, a dopant concentration of the second semiconductor layer is greater than a dopant concentration of the first semiconductor layer, wherein the fin sidewall spacer extends along a sidewall surface of the first semiconductor layer, wherein the silicide layer is formed on a sidewall surface of the second semiconductor layer.

10. A method, comprising:

receiving a workpiece comprising:

a dummy gate structure formed over a channel region, the channel region comprising a plurality of channel layers interleaved by a plurality of sacrificial layers, and a source/drain feature disposed adjacent to the channel region and coupled to the channel region;

forming a semiconductor layer having a first portion extending on a sidewall surface of the source/drain feature and a second portion extending over a top surface of the source/drain feature, wherein a composition of the semiconductor layer is different than a composition of the source/drain feature, wherein a thickness of the second portion is greater than a thickness of the first portion;

after the forming of the semiconductor layer, selectively removing the dummy gate structure;

selectively removing the plurality of sacrificial layers;

forming a gate stack to wrap around and over the plurality of channel layers;

after the forming of the gate stack, forming a first opening exposing the semiconductor layer;

after the forming of the first opening, selectively and partially removing the semiconductor layer to form a second opening to expose the source/drain feature, wherein the selectively and partially removing of the semiconductor layer comprises performing an isotropic etching process to selectively remove an entirety of the second portion and a part of the first portion of the semiconductor layer without substantially etching the source/drain feature;

forming a silicide layer in the second opening; and forming a metal contact in the first opening.

11. The method of claim 10, wherein the forming of the semiconductor layer comprises performing an epitaxial growth process.

12. The method of claim 10, wherein the source/drain feature comprises:

a first epitaxial layer; and a second epitaxial layer formed on the first epitaxial layer, wherein a concentration of dopants in the second epitaxial layer is greater than a concentration of dopants in the first epitaxial layer.

13. The method of claim 10, further comprising:

after the forming of the semiconductor layer, forming an etch stop layer over the source/drain feature; and forming an interlayer dielectric (ILD) layer over the etch stop layer, wherein the forming of the first opening comprises removing portions of the etch stop layer and the ILD layer to expose the second portion of the semiconductor layer.

14. A method, comprising:

forming a source/drain feature over a substrate;

forming a dummy layer extending along a top surface and a sidewall surface of the source/drain feature;

after the forming of the dummy layer, forming a dielectric structure over the dummy layer and the source/drain feature;

forming an opening extending through the dielectric structure to partially expose the dummy layer;

selectively removing the dummy layer without substantially etching the source/drain feature; and after the selectively removing of the dummy layer, forming a silicide layer in the opening and a source/drain contact over the silicide layer, wherein, in a cross-section, the silicide layer comprises a first portion extending along the top surface of the source/drain feature and a second portion extending along the sidewall surface of the source/drain feature, wherein a thickness of the second portion is non-uniform from bottom to top.

15. The method of claim 14, wherein the thickness of the first portion of the silicide layer is greater than the thickness of the second portion of the silicide layer.

16. The method of claim 15, wherein, the first portion of the silicide layer spans a first width, and a bottom surface of the source/drain contact spans a second width less than the first width.

17. The method of claim 10, wherein the channel region further comprises a base fin protruding from a substrate, wherein the plurality of channel layers and the plurality of sacrificial layers are disposed over the base fin, and the workpiece further comprises:

an isolation feature surrounding a lower portion of the base fin; and a fin sidewall spacer on the isolation feature and surrounding an upper portion the base fin, wherein the semiconductor layer is spaced apart from the isolation feature and the fin sidewall spacer.

18. The method of claim 14, further comprising:

forming a fin sidewall spacer disposed adjacent to a lower portion of the source/drain feature, wherein the dummy layer is spaced apart from the fin sidewall spacer.

19. The method of claim 3, further comprising:

forming inner spacers disposed between the source/drain feature and the gate stack.

20. The method of claim 10, wherein the silicide layer comprises a first portion on a top surface of the source/drain feature and a second portion on a sidewall surface of the source/drain feature, wherein the second portion of the silicide layer has a non-uniform thickness.

* * * * *